United States Patent
Nozawa

(10) Patent No.: US 9,397,115 B1
(45) Date of Patent: Jul. 19, 2016

(54) METHODS FOR MAKING A TRIM-RATE TOLERANT SELF-ALIGNED CONTACT VIA STRUCTURE ARRAY

(71) Applicant: SanDisk Technologies, Inc., Plano, TX (US)

(72) Inventor: Kei Nozawa, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 16 days.

(21) Appl. No.: 14/584,179

(22) Filed: Dec. 29, 2014

(51) Int. Cl.
*H01L 29/78* (2006.01)
*H01L 27/115* (2006.01)
*H01L 21/768* (2006.01)
*H01L 21/311* (2006.01)
*H01L 21/02* (2006.01)
*H01L 21/28* (2006.01)

(52) U.S. Cl.
CPC ...... *H01L 27/11582* (2013.01); *H01L 21/0217* (2013.01); *H01L 21/02164* (2013.01); *H01L 21/28273* (2013.01); *H01L 21/28282* (2013.01); *H01L 21/31111* (2013.01); *H01L 21/31144* (2013.01); *H01L 21/76802* (2013.01); *H01L 21/76897* (2013.01); *H01L 27/1157* (2013.01); *H01L 27/11524* (2013.01); *H01L 27/11556* (2013.01)

(58) Field of Classification Search
CPC .................................................. H01L 29/7802
USPC .................. 438/268; 365/185.08, 185.17
See application file for complete search history.

(56) References Cited

U.S. PATENT DOCUMENTS

| | | | |
|---|---|---|---|
| 8,759,217 B1* | 6/2014 | Chen | H01L 21/76838 438/689 |
| 2010/0112483 A1* | 5/2010 | Wing Ngai | H01L 21/0273 430/296 |
| 2013/0341701 A1 | 12/2013 | Blomme et al. | |

OTHER PUBLICATIONS

U.S. Appl. No. 14/133,979, filed Dec. 19, 2013, SanDisk Technologies Inc.
U.S. Appl. No. 14/225,116, filed Mar. 25, 2014, SanDisk Technologies Inc.
U.S. Appl. No. 14/225,176, filed Mar. 25, 2014, SanDisk Technologies Inc.
U.S. Appl. No. 14/317,274, filed Jun. 27, 2014, SanDisk Technologies Inc.
U.S. Appl. No. 14/501,441, filed Sep. 30, 2014, SanDisk Technologies Inc.
U.S. Appl. No. 14/501,389, filed Sep. 30, 2014, SanDisk Technologies Inc.

* cited by examiner

*Primary Examiner* — Edward Wojciechowicz
(74) *Attorney, Agent, or Firm* — The Marbury Law Group PLLC

(57) ABSTRACT

A stack is formed over a substrate, which comprises an alternating plurality of first material layers including a first material and second material layers including a second material. A patterned hard mask is formed, which includes multiple laterally spaced apart strips. A trimming material layer is formed over the hard mask layer. At least one cycle of process steps is subsequent performed, which include etching the first material employing the second material and the trimming material layer as an etch mask, trimming the trimming material layer to expose a strip of the hard mask layer, etching the second material and the exposed strip of the hard mask layer employing the trimming material layer as an etch mask, and trimming the trimming material layer to expose an edge of a next strip of the hard mask layer. Stepped surfaces suitable for formation of contact via array can thus be formed.

33 Claims, 23 Drawing Sheets

US 9,397,115 B1

METHODS FOR MAKING A TRIM-RATE TOLERANT SELF-ALIGNED CONTACT VIA STRUCTURE ARRAY

FIELD

The present disclosure relates generally to the field of metal interconnect structures and specifically to metal interconnect structures including multiple electrically shorted conductive layers for vertical semiconductor devices and methods of making thereof.

BACKGROUND

Multilevel metal interconnect structures are routinely employed to provide electrical wiring for a high density circuitry, such as semiconductor devices on a substrate. Continuous scaling of semiconductor devices leads to a higher wiring density as well as an increase in the number of wiring levels. For example, a 3D NAND stacked memory device may include at least as many number of wiring levels as the total number of control gate electrodes employed for the 3D NAND stacked memory device. Each of the conductive layers in the wiring levels needs to be provided with an electrical contact.

SUMMARY

According to an aspect of the present disclosure, a method of fabricating a multilevel structure is provided. A stack comprising an alternating plurality of first material layers and second material layers is formed over a substrate. A hard mask layer is formed over the stack, and is patterned into multiple portions that are laterally spaced apart. A trimming material layer is formed and is patterned over the patterned hard mask layer. At least one set of process steps is performed. Each set of process steps includes at least a first process step of etching at least one physically exposed portion of the first material layers in a first etch process employing a combination of the patterned trimming material layer and the patterned hard mask layer as an etch mask, a second process step of trimming the trimming material layer after the first etch process, and a third process step of etching at least one physically exposed portion of the second material layers and a physically exposed portion of the patterned hard mask layer in a second etch process employing the trimming material layer as an etch mask.

DETAILED DESCRIPTION

As discussed above, the present disclosure is directed to metal interconnect structures including multiple electrically shorted conductive layers for vertical semiconductor devices and methods of making the same, the various aspects of which are described below. The embodiments of the disclosure can be employed to form various structures including a multilevel metal interconnect structure, a non-limiting example of which includes semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three dimensional memory devices of the present disclosure include a monolithic three-dimensional NAND string memory device, and can be fabricated employing the various embodiments described herein.

Figure 1:
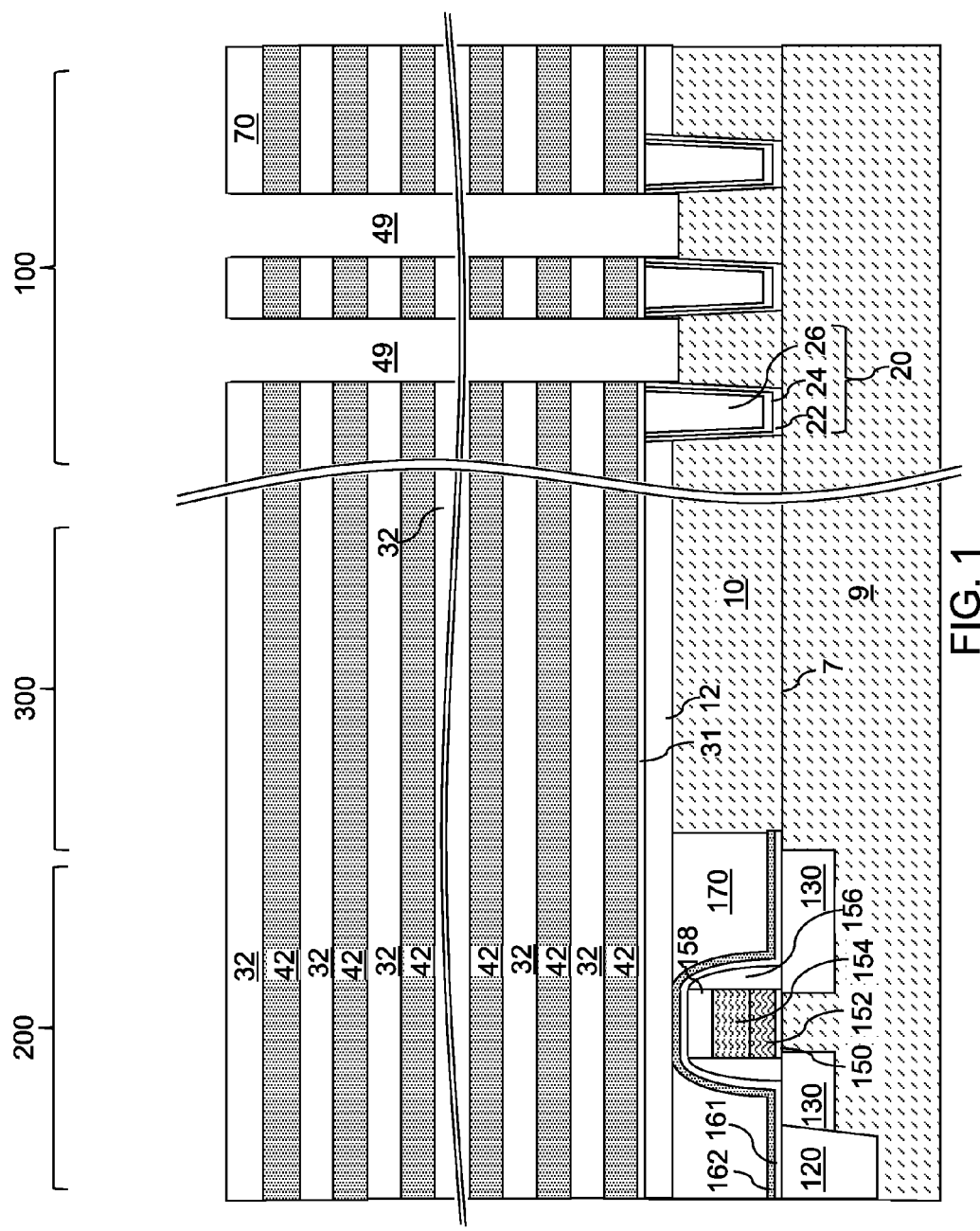
FIG. 1 is a vertical cross-sectional view of an exemplary structure after formation of a stack of an alternating plurality of material layers and memory holes through the stack according to a first embodiment of the present disclosure.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The region in which the at least one semiconductor device for the peripheral circuitry is herein referred to as a peripheral device region 200. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

Optionally, a semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

At least one optional shallow trench can be formed through the dielectric pad layer 12 and an upper portion of the semiconductor material layer 10. The pattern of the at least one shallow trench can be selected such that lower select gate electrodes can be subsequently formed therein. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference.

A lower select gate structure 20 can be formed in each of the at least one shallow trench, for example, by forming a gate dielectric layer and at least one conductive material layer, and removing portions of the gate dielectric layer and the at least one conductive material layer from above the top surface of the dielectric pad layer 12, for example, by chemical mechanical planarization. Each lower select gate structure 20 can include a gate dielectric 22 and a gate electrode (24, 26). In one embodiment, each gate electrode (24, 26) can include a metallic liner 24 and a conductive material portion 26. The metallic liner 24 can include, for example, TiN, TaN, WN, or a combination thereof. The conductive material portion 26 can include, for example, W, Al, Cu, or combinations thereof. At least one optional shallow trench isolation structure (not shown) and/or at least one deep trench isolation structure (not shown) may be employed to provide electrical isolation among various semiconductor devices that are present, or are to be subsequently formed, on the substrate.

A dielectric cap layer 31 can be optionally formed. The dielectric cap layer 31 includes a dielectric material, and can be formed directly on top surfaces of the gate electrodes (24, 26). Exemplary materials that can be employed for the dielectric cap layer 31 include, but are not limited to, silicon oxide, a dielectric metal oxide, and silicon nitride (in case the material of second material layers to be subsequently formed is not silicon nitride). The dielectric cap layer 31 provides electrical isolation for the gate electrodes (24, 26).

A stack of an alternating plurality of first material layers (which can be insulating layers 32) and second material layers (which can be sacrificial material layer (42L, 42C, 42U)) is formed over the top surface of the substrate, which can be, for example, on the top surface of the dielectric cap layer 31. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulator layer 32, and each second material layer can be a sacrificial material layer 42. In this case, the stack can include an alternating plurality of insulator layers 32 and sacrificial material layers 42.

The stack of the alternating plurality is herein referred to as an alternating stack (32, 42). In one embodiment, the alternating stack (32, 42) can include insulator layers 32 composed of the first material, and sacrificial material layers 42 composed of a second material different from that of insulator layers 32. The first material of the insulator layers 32 can be at least one electrically insulating material. As such, each insulator layer 32 can be an electrically insulating material layer. Electrically insulating materials that can be employed for the insulator layers 32 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulator layers 32 can be silicon oxide.

The second material of the sacrificial material layers 42 is a sacrificial material that can be removed selective to the first material of the insulator layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an electrically insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be material layers that comprise silicon nitride or a semiconductor material including at least one of silicon and germanium.

In one embodiment, the insulator layers 32 can include silicon oxide, and sacrificial material layers can include silicon nitride sacrificial material layers. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulator layers 32 and the sacrificial material layers 42 can be in a range from 20 nm to 50 nm, although lesser and greater thicknesses can be employed for each insulator layer 32 and for each sacrificial material layer 42. The number of repetitions of the pairs of an insulator layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Subsequently, a lithographic material stack (not shown) including at least a photoresist layer can be formed over the alternating stack (32, 42), and can be lithographically patterned to form openings therein. The pattern in the lithographic material stack can be transferred through the entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing. The region in which the memory openings 49 are formed is herein referred to as a device region 100. A contact region 300 can be provided adjacent to the device region 100. A set of stepped surfaces and control gate contact via structures (not shown) can be subsequently formed in the contact region 300.

The memory openings 49 are formed through the dielectric cap layer 31 and the dielectric pad layer 12 so that the memory openings 49 extend from the top surface of the alternating stack (32, 42) to the top surface of the semiconductor material layer 10 within the substrate between the lower select gate electrodes (24, 26). In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the semiconductor material layer 10.

Figure 2:
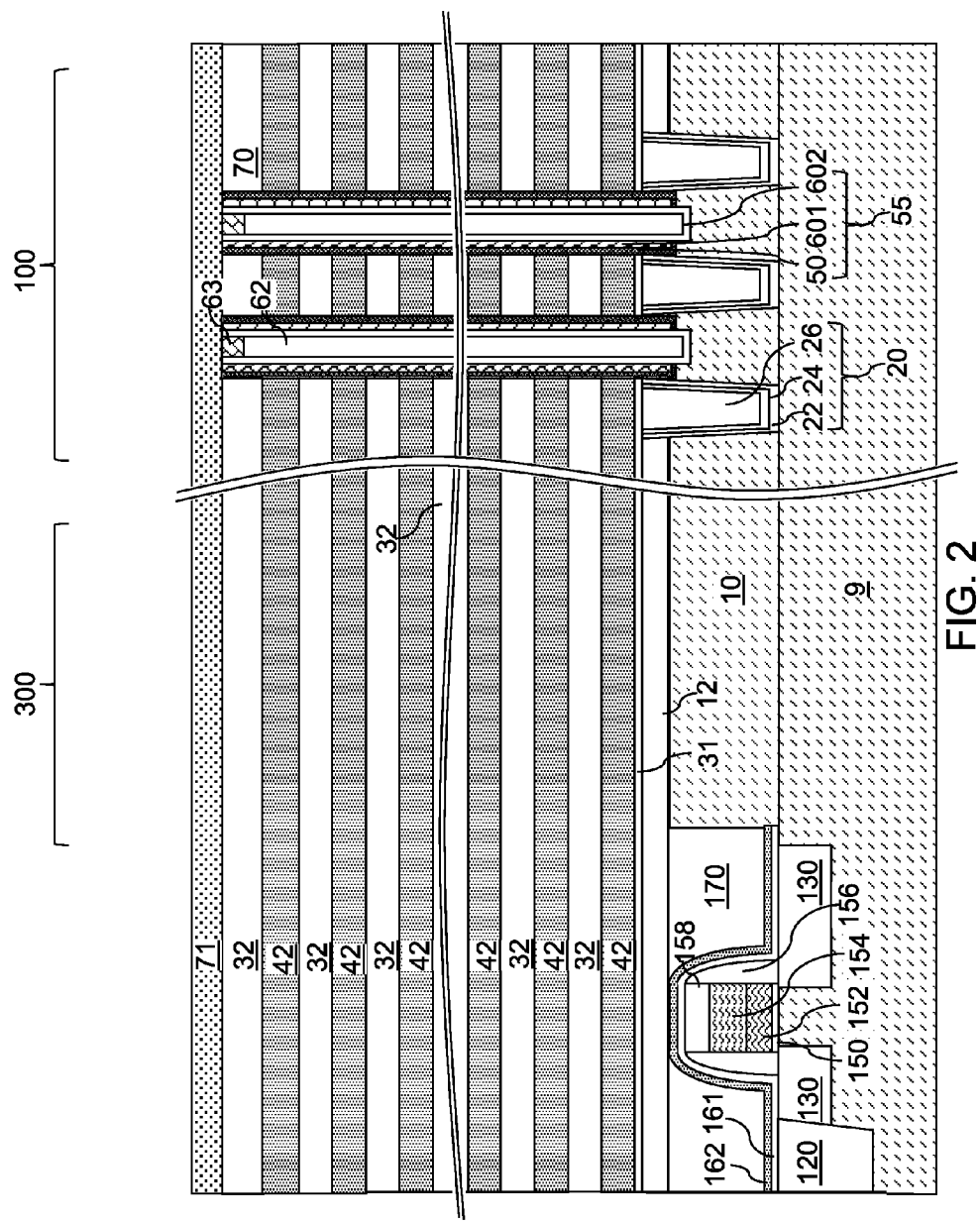
FIG. 2 is a vertical cross-sectional view of the exemplary structure after formation of memory stack structures and a planarization stop layer according to an embodiment of the present disclosure.

Referring to FIG. 2, a memory stack structure 55 can be formed within each memory opening through the alternating stack (32, 42). The memory stack structures 55 can be formed, for example, by depositing a memory film layer in the memory openings and over the alternating stack (32, 42), and by anisotropically etching the memory film layer. The memory film layer can be a stack of contiguous material layers that overlie the entirety of the alternating stack (31, 42). The memory film layer contacts all sidewall surface(s) and all bottom surface(s) of the memory openings. The memory film layer is a contiguous film stack that provides the functionality of charge storage in the absence of an external electrical bias voltage, while enabling charge transfer in the presence of a suitable external electrical bias voltage.

In one embodiment, the memory film layer can be a stack, in the order of formation, of a blocking dielectric layer, a charge storage layer, and a tunnel dielectric layer. In one embodiment, a plurality of floating gates or a charge storage dielectric can be located between the tunneling dielectric layer and the blocking dielectric layer.

The blocking dielectric layer contacts the sidewalls of the memory openings. Specifically, the blocking dielectric layer can contact the sidewalls of the sacrificial layers 42. The blocking dielectric layer may include one or more dielectric material layers that can function as the dielectric material(s) of a control gate dielectric between the sacrificial layers 42 and charge storage regions to be subsequently formed out of the charge storage layer. The blocking dielectric layer can include silicon oxide, a dielectric metal oxide, a dielectric metal oxynitride, or a combination thereof. In one embodiment, the blocking dielectric layer can include a stack of at least one silicon oxide layer and at least one dielectric metal oxide layer. The blocking dielectric layer can be formed by a conformal deposition process such as chemical vapor deposition (CVD) and/or atomic layer deposition (ALD), and/or by deposition of a conformal material layer (such as an amorphous silicon layer) and subsequent conversion of the conformal material layer into a dielectric material layer (such as a silicon oxide layer). The thickness of the blocking dielectric layer can be in a range from 6 nm to 24 nm, although lesser and greater thicknesses can also be employed. Alternatively, the blocking dielectric layer may be omitted from the memory opening, and instead be formed through the backside contact trench in recesses formed by removal of the sacrificial layers 42 prior to forming the metal control gate electrodes through a backside contact trench.

The charge storage layer includes a dielectric charge trapping material, which can be, for example, silicon nitride, or a conductive material such as doped polysilicon or a metallic material. In one embodiment, the charge storage layer includes silicon nitride. The charge storage layer can be formed as a single charge storage layer of homogeneous composition, or can include a stack of multiple charge storage material layers. The multiple charge storage material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer may comprise an insulating charge trapping material, such as one or more silicon nitride segments. Alternatively, the charge storage layer may comprise conductive nanoparticles such as metal nanoparticles, which can be, for example, ruthenium nanoparticles. The charge storage layer can be formed, for example, by chemical vapor deposition (CVD), atomic layer deposition (ALD), physical vapor deposition (PVD), or any suitable deposition technique for the selected material(s) for the charge storage layer. The thickness of the charge storage layer can be in a range from 2 nm to 20 nm, although lesser and greater thicknesses can also be employed.

The tunnel dielectric layer includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer can include a stack of a first silicon oxide layer, a silicon oxynitride layer, and a second silicon oxide layer, which is commonly known as an ONO stack. In one embodiment, the tunneling dielectric layer can include a silicon oxide layer that is substantially free of carbon or a silicon oxynitride layer that is substantially free of carbon. The thickness of the tunnel dielectric layer can be in a range from 2 nm to 20 nm, although lesser and greater thicknesses can also be employed.

Optionally, a permanent channel material layer (such as a polysilicon layer) and/or a sacrificial layer (such as a dielectric material layer) may be formed on the memory film layer. The memory film layer (and any additional layer such as a permanent channel material layer or a sacrificial layer) can be anisotropically etched so that horizontal portions of the memory film layer (and any additional layer) are removed from above the top surface of the alternating stack (32, 42) and at the bottom of each memory opening. Each remaining vertical portion of the memory film layer that remains within a memory opening after the anisotropic etch constitutes a memory film 50. Each memory film 50 can be homeomorphic to a torus. As used herein, an element is homeomorphic to a geometrical shape if the shape of the element can be mapped to the geometrical shape by continuous deformation without creation or destruction of any hole. If an electrode underlies the memory openings, a top surface of the electrode can be physically exposed within the cavity defined by the inner sidewalls of an overlying memory film 50.

A semiconductor channel (601, 602) can be formed by depositing at least one semiconductor material on the inner sidewalls of the memory films 50 and on semiconductor surfaces of the semiconductor material layer 10 at the bottom of the memory openings. In an illustrative example, a first semiconductor channel layer can be deposited directly on the surfaces of the memory films 50 by a conformal deposition method such as chemical vapor deposition (CVD). The first semiconductor channel layer and the memory films can be anisotropically etched to form an opening at a bottom portion of each memory opening. A top surface of the substrate semiconductor layer 10 is physically exposed at the bottom of each memory opening. Each remaining portion of the first semiconductor channel layer within a memory opening constitutes a first semiconductor channel portion 601. A second semiconductor channel layer can be deposited on the sidewalls of the first semiconductor channel portions 601, physically exposed surfaces of the substrate semiconductor layer 10 within the memory openings, and over the alternating stack (32, 42). The semiconductor material of the second semiconductor channel layer can include a doped polycrystalline semiconductor material (such as doped polysilicon), or can include a doped amorphous semiconductor material (such as amorphous silicon) that can be subsequently converted into a doped polycrystalline semiconductor material after a suitable anneal at an elevated temperature.

Optionally, a dielectric core 62 can be formed within a cavity inside each semiconductor channel 60, for example, by deposition of a dielectric material such as silicon oxide, and subsequent planarization of the dielectric material. The planarization of the dielectric material removes the portion of the deposited dielectric material from above the top surface of the horizontal plane including the top surface of the topmost layer of the alternating stack (32, 42), which can be, for example, the top surface of the topmost insulator layer 32. The planarization of the dielectric material can be performed, for example, by chemical mechanical planarization. Each remaining portion of the dielectric material inside a memory opening constitutes a dielectric core 62. The dielectric core 62 is an optional component, and a combination of a memory film 50 and a semiconductor channel 60 may completely fill a memory opening.

The horizontal portion of the second semiconductor channel layer above the top surface of the topmost layer of the alternating stack (32, 42) can be removed, for example, by a recess etch. Each remaining portion of the second semiconductor channel layer constitutes a second semiconductor channel 602. Each adjoined pair of a first semiconductor channel 601 and a second semiconductor channel vertically extend through the alternating stack (32, 42), and collectively constitutes a portion of a semiconductor channel (601, 602) for a memory stack structure 55. A set of a memory film 50 and a semiconductor channel (601, 602) within a same memory opening constitutes a memory stack structure 55.

Drain regions 63 can be formed by recessing a top portion of each dielectric core and depositing a doped semiconductor material. The doped semiconductor material can be, for example, doped polysilicon. Excess portions of the deposited semiconductor material can be removed from above the top surface of the alternating stack (32, 42), for example, by chemical mechanical planarization (CMP) or a recess etch.

Optionally, a planarization stop layer 71 can be formed over the alternating stack (32, 42) and the array of memory stack structures 55. The planarization stop layer 71 can include a material that can be employed as a stopping layer during a planarization process such as chemical mechanical planarization (CMP). In one embodiment, the planarization stop layer 71 can include silicon nitride, a dielectric metal oxide, a nitrogen-doped organosilicate glass, and/or a metallic nitride material such as TiN or WN. In one embodiment, the planarization stop layer 71 can include a dielectric material that can be removed selective to the first material of the insulator layers 32. For example, the planarization stop layer 71 can include a dielectric material such as silicon nitride or a dielectric metal oxide. The thickness of the planarization stop layer 71 can be in a range from 5 nm to 100 nm, although lesser and greater thicknesses can also be employed.

Figure 3:
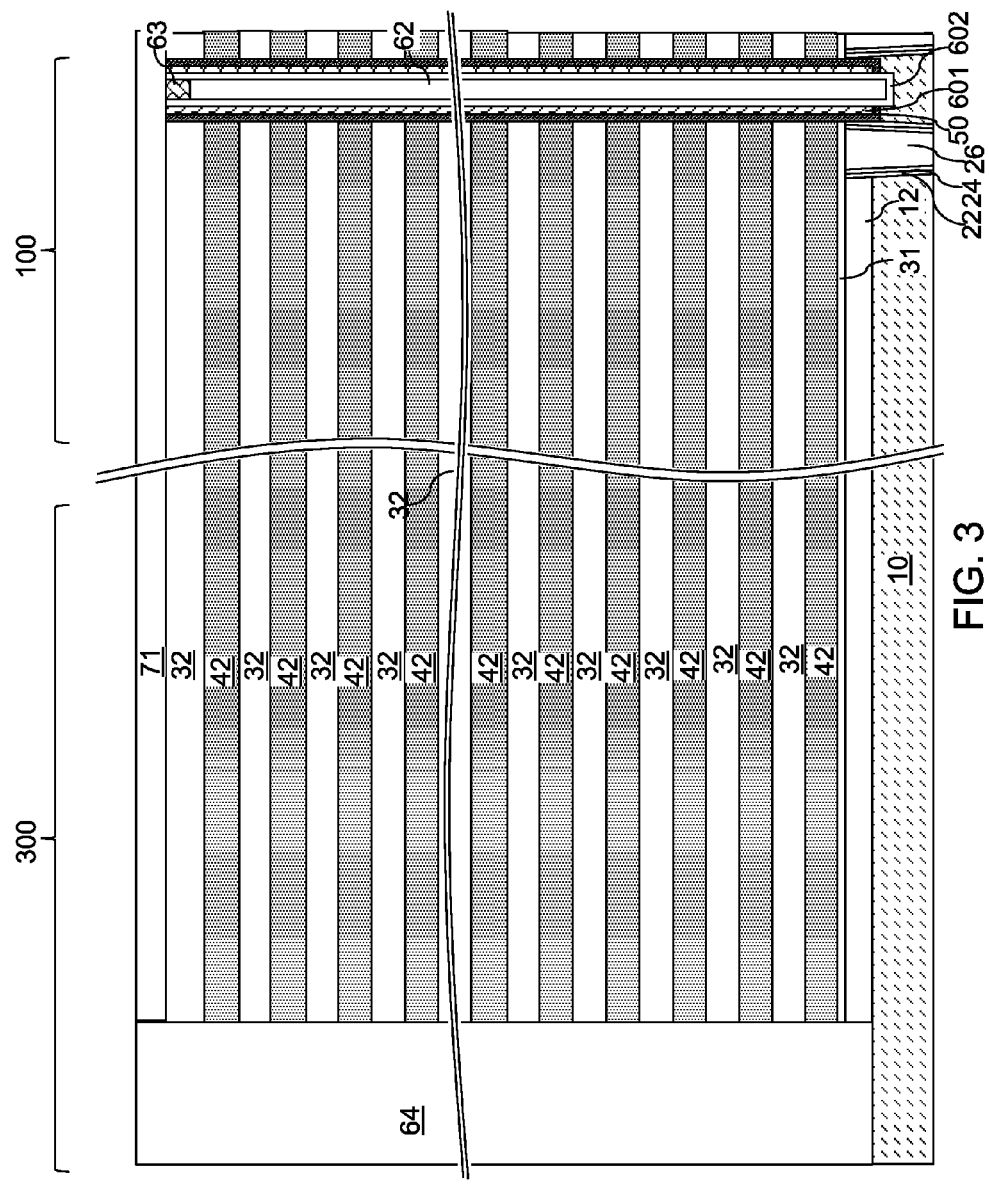
FIG. 3 is a vertical cross-sectional view of the exemplary structure after formation of an optional dielectric material portion according to an embodiment of the present disclosure.

Referring to FIG. 3, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed. Subsequently, the trench can be filled with an optional dielectric material such as silicon oxide. Excess portions of the dielectric material can be removed from above the top surface of the planarization stop layer 71 by a planarization process such as chemical mechanical planarization and/or a recess etch. The top surfaces of the planarization stop layer 71 can be employed as a stopping surface during the planarization. The planarization stop layer 71 can be removed at least partially during the planarization process. Any remaining portion of the planarization stop layer 71 can be removed in a subsequent etch process selective to the dielectric material of the topmost layer of the alternating stack (32, 42), e.g., selective to the dielectric material of the topmost insulator layer 32. Optionally, the top surface of the dielectric material portion 64 may be vertically recessed so that the top surface of the dielectric material portion 64 is substantially coplanar with the top surface of the topmost layer of the alternating stack (32, 42).

Figure 4:
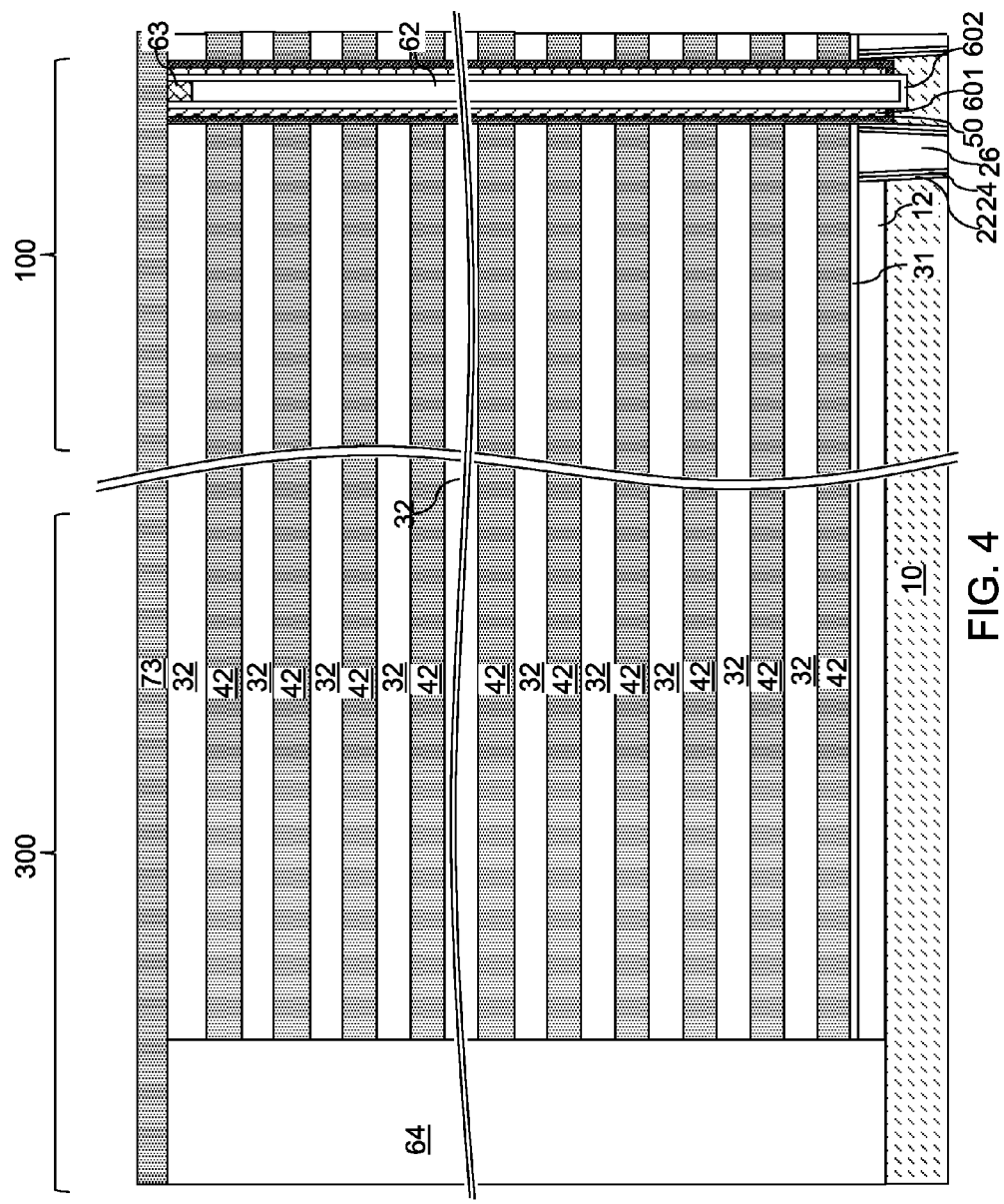
FIG. 4 is a vertical cross-sectional view of the exemplary structure after formation of a hard mask layer according to an embodiment of the present disclosure.

Referring to FIG. 4, a hard mask layer 73 is formed over the alternating stack (32, 42). The hard mask layer 73 includes a material that is different from the material of the first material layers (e.g., the insulator layers 32). The material of the hard mask layer 73 can be the same as, or can be different from, the material of the second material layers (e.g., the sacrificial material layers 42). In one embodiment, the hard mask layer 73 comprises the same material as the second material layers 42. In one embodiment, the hard mask layer 73 and the second material layers 43 can comprise silicon nitride. In one embodiment, the first material layers (e.g., the insulator layers 32) can comprise silicon oxide.

In one embodiment, the topmost layer of the alternating stack (32, 42) can be a topmost first material layer (e.g., a topmost insulator layer 32), and the hard mask layer 73 can be formed directly on the topmost first material layer. The hard mask layer 73 can be deposited on the planar topmost surface of the alternating stack (32, 42) by a deposition method such as chemical vapor deposition (CVD). The thickness of the hard mask layer 73 is selected such that the entire thickness of the hard mask layer 73 can be etched collaterally during a subsequently anisotropic etch of any one of the second material layers (e.g., the sacrificial material layers 42). In one embodiment, the hard mask layer 73 comprises the same material as the second material layers 42, and the hard mask layer 73 has a thickness that is not greater than (i.e., the same as or less than) the maximum thickness of the second material layers (e.g., the sacrificial material layers 42). In another embodiment, the second material layers can have the same thickness as, or a greater thickness than, the thickness of the hard mask layer 73.

Figure 5:
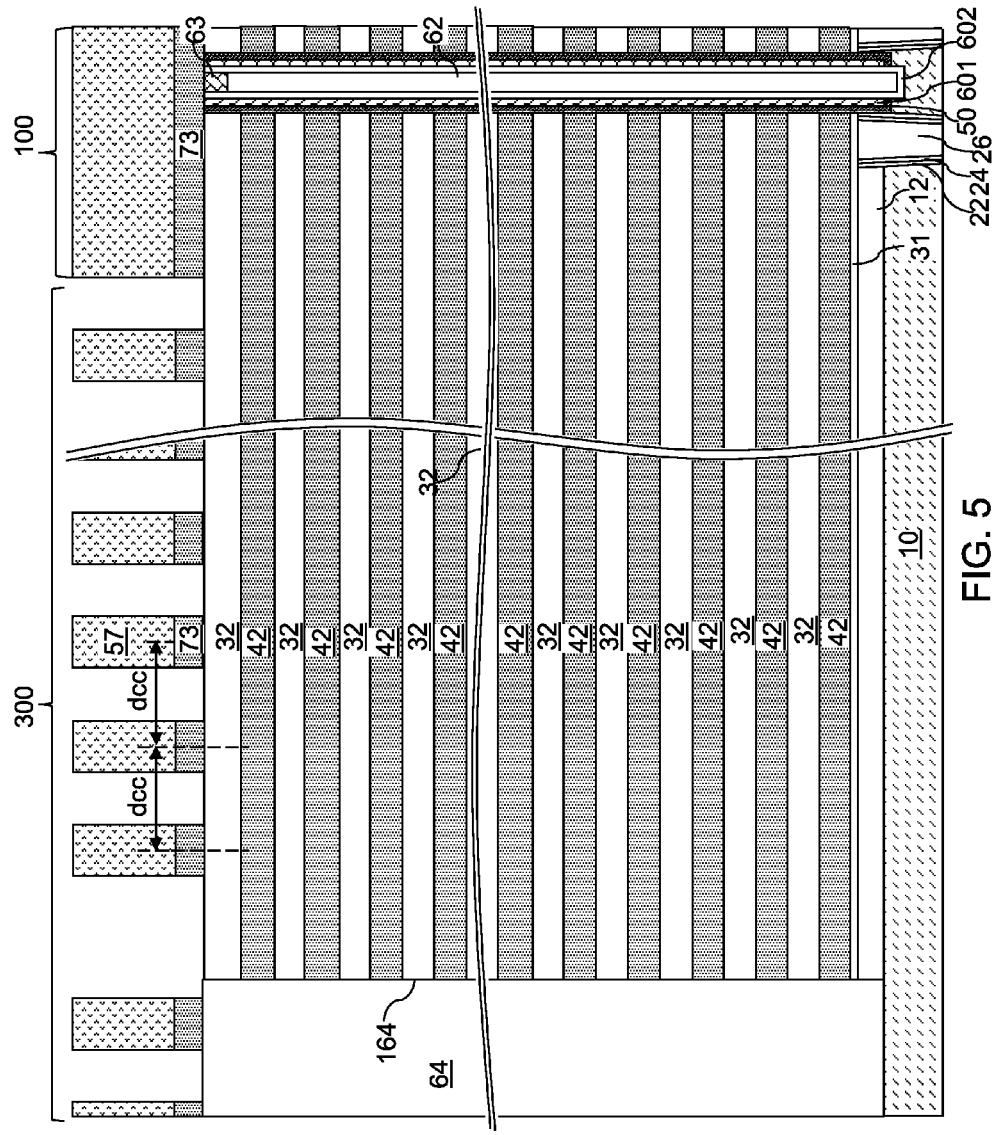
FIG. 5 is a vertical cross-sectional view of the exemplary structure after patterning the hard mask layer according to an embodiment of the present disclosure.

Referring to FIG. 5, a photoresist layer 57 can be applied over the hard mask layer 73, and can be lithographically patterned to form a plurality of patterned portions that are spaced apart. The pattern in the photoresist layer 57 is transferred through the hard mask layer 73 to pattern the hard mask layer 73 into multiple portions that are laterally spaced apart. In one embodiment, the patterned multiple portions of the hard mask layer 73 comprise strips having parallel edges. The parallel edges of the strips can extend along a same horizontal direction, which can be, for example, the direction perpendicular to the vertical cross-sectional plane of FIG. 5. The photoresist layer 57 can be subsequently removed, for example, by ashing.

In one embodiment, the center-to-center distance dcc between each neighboring pair of patterned multiple portions of the hard mask layer 73 can be the same. In one embodiment, the patterned multiple portions of the hard mask layer 73 can be a periodic one-dimensional array having a repetition of a unit pattern. In this case, the patterned multiple portions of the hard mask layer 73 can have a uniform pitch, which can be the same as the center-to-center distance dcc. In one embodiment, a center-to-center distance between each neighboring pair of patterned multiple portions of the hard mask layer 73 can be the same, and the patterned multiple portions of the hard mask layer 73 can constitute a periodic one-dimensional array having a repetition of a unit pattern.

In one embodiment, neighboring pairs of patterned multiple portions of the hard mask layer 73 can have at least two different center-to-center distances, and the patterned multiple portions of the hard mask layer have at least two different widths. In this case, a plurality of steps to be subsequently formed can have at least two different step widths.

In one embodiment, the total number of laterally spaced patterned portions of the hard mask layer 73 located in a region extending from a substantially vertical interface 164 between the alternating stack (32, 42) and the dielectric material portion 64 to the device region 100 can be the same as the total number of sacrificial material layers 42 within the alternating stack (32, 42) less one. If the total number of sacrificial material layers 42 in the alternating stack (32, 42) is n, the total number of laterally spaced patterned portions of the hard mask layer 73 located in the region extending from a substantially vertical interface 164 between the alternating stack (32, 42) and the dielectric material portion 64 to the device region 100 can be n−1.

Figure 6:
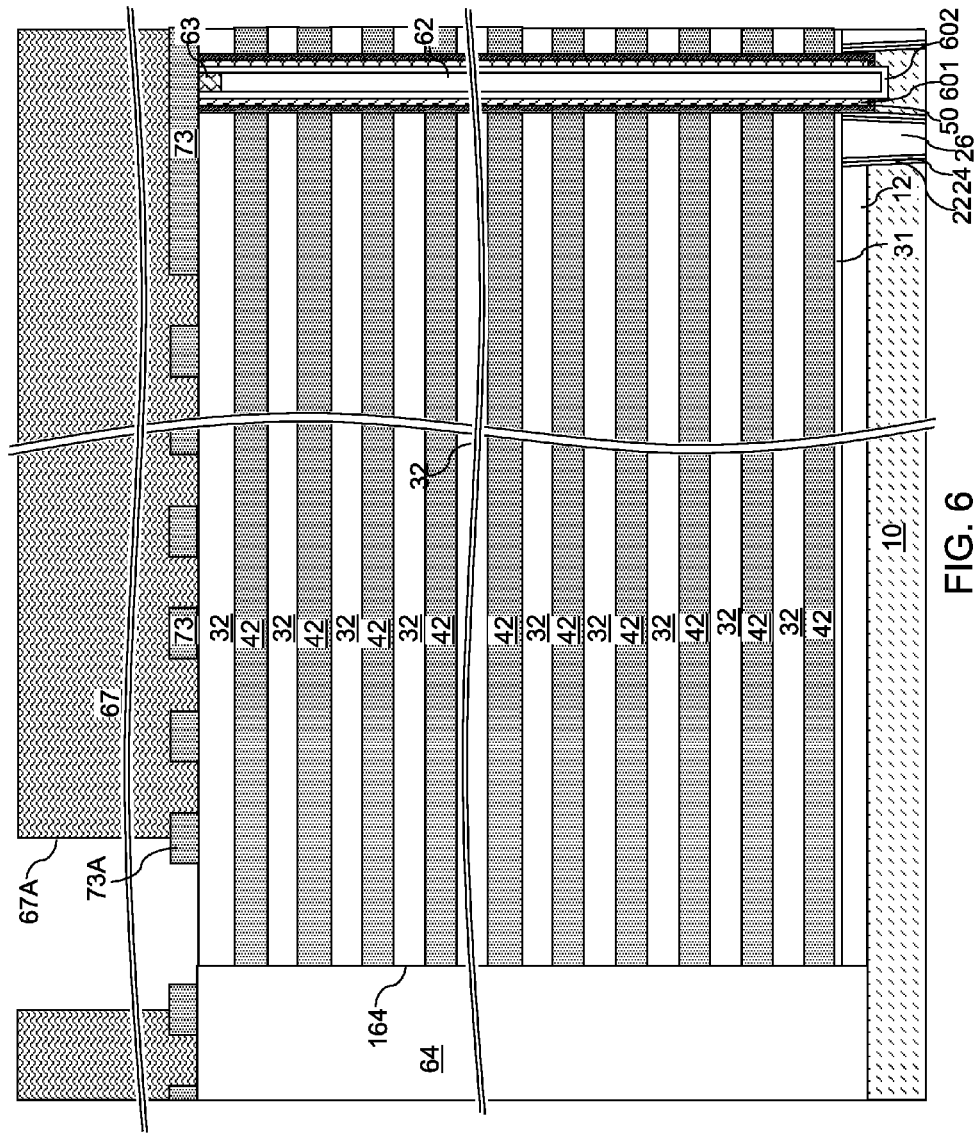
FIG. 6 is a vertical cross-sectional view of the exemplary structure after formation of a trimming material layer according to an embodiment of the present disclosure.

Referring to FIG. 6, a trimming material layer 67 is formed and patterned over the patterned hard mask layer 73. The trimming material layer 67 comprises a material that can be continually trimmed, i.e., a material that can be gradually removed over a time duration from outside to inside at a controlled removal rate. For example, the trimming material layer 67 can be selected from a photoresist material, an organic polymer material, and an inorganic polymer material. Organic polymer materials that can be employed for the trimming material layer 67 can be an organic material made of cross-linked carbon-containing monomers, and can be carbon-based self-planarizing material known in the art. Inorganic polymer material that can be employed for the trimming material layer 67 include silicon-based polymer materials such as silicon-based antireflective coating materials as known in the art. A portion of the trimming material layer 67 remains after repeated trimming that shifts an outer sidewall of the trimming material layer 67 to a periphery of the contact region 300 adjoining the device region 100.

The trimming material layer 67 can be applied over the patterned hard mask layer 73 as a blanket material layer, i.e., as an unpatterned material layer. In one embodiment, the trimming material layer 67 can be applied by a self-planarizing deposition process such as spin coating. The trimming material layer 67 can be directly patterned by photolithographic exposure and development if the trimming material layer 67 includes a photosensitive material, or can be patterned by application of a photoresist layer (not shown) thereupon, lithographic patterning of the photoresist layer, and transfer of the pattern of the photoresist layer through the trimming material layer 67 selective to the patterned hard mask layer 73. As initially patterned, the trimming material layer 67 can have a sidewall that adjoins a top surface of a remaining portion among the multiple portions of the hard mask layer 73. In one embodiment, a sidewall 67A of the trimming material layer 67 can overlie a top surface of a portion 73A of the hard mask layer 73 that overlies the alternating stack (32, 42). In one embodiment, the portion 73A of the hard mask layer 73 that underlies the sidewall 67A of the trimming material layer 67 is most proximate to a vertical interface 164 between the dielectric material portion 64 and the alternating stack (32, 42) among the plurality of laterally spaced portions of the hard mask layer 73 that overlie the alternating stack (32, 42). In one embodiment, a sidewall of the trimming material layer 67 can straddle a center region of the patterned portion 73A of the hard mask layer 73 that overlies the alternating stack (32, 42) and is most proximal to the interface 164 between the alternating stack (32, 42) and the dielectric material portion 64.

In one embodiment, the pitch of the multiple portions of the hard mask layer 73 can be about the sum of four times a trimming width variation of the trimming material layer 67 and a variance in critical dimension of a lithographic process employed to pattern the hard mask layer 73. Alternatively, the pitch of the multiple portions of the hard mask layer 73 can be greater than the sum of four times a trimming width variation of the trimming material layer 67 and a variance in critical dimension of a lithographic process employed to pattern the hard mask layer 73. As used herein, a "trimming width variation" refers to inherent variation in the trimming distance for a given trimming process that trims a trimming material layer.

Figure 7:
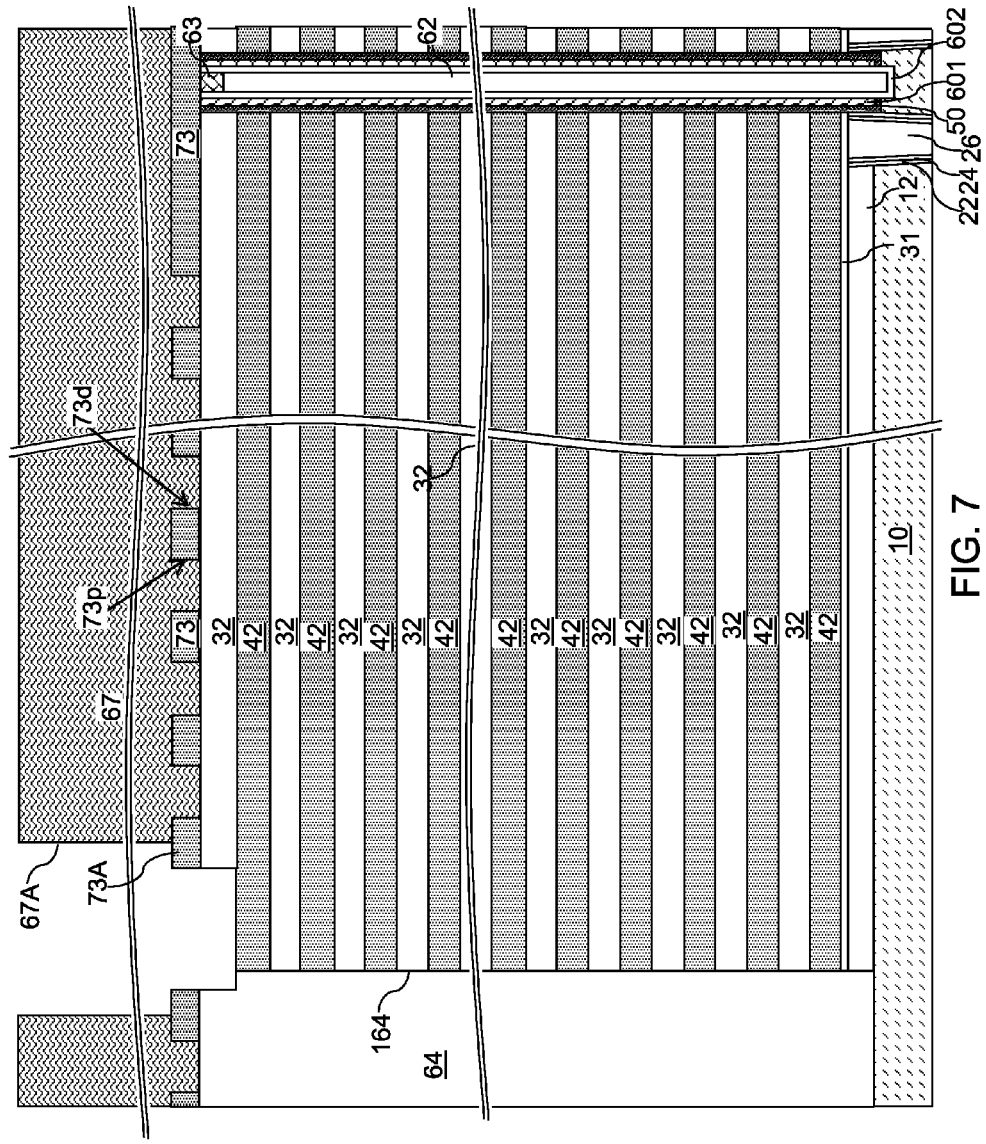
FIG. 7 is a vertical cross-sectional view of the exemplary structure after performing a first process step of a first set of process steps according to an embodiment of the present disclosure.

Referring to FIG. 7, a set of process steps is performed at least once to sequentially transfer features of the patterned hard mask layer 73. The processing step that initiates the transfer each feature of the patterned hard mask layer 73 is sequentially offset from the initial processing steps by a number of processing steps, of which the total number is correlated to the lateral distance of the features of the patterned hard mask layer 73 from the location of the initial sidewall of the trimming material layer 67. Specifically, features of each proximal sidewall 73p of the multiple portions of the patterned hard mask layer 73 that is proximal to the interface 164 between the alternating stack (32, 42) and the dielectric material layer 64 are transferred as steps in the alternating stack (32, 42) in the subsequent sets of process steps that are performed in cycles. Features of each distal sidewall 73d of the multiple portions of the patterned hard mask layer 73 that is distal from the interface 164 between the alternating stack (32, 42) and the dielectric material layer 64 are not transferred.

The set of process steps can be performed multiple times. For example, a first set of process steps can be performed, the second set of process steps can be performed, and so on. Each set of process steps can have an identical sequence of process steps. The view of FIG. 7 illustrates the exemplary structure after performing a first process step of a first set of process steps.

Specifically, the first process step can be a step of etching at least one physically exposed portion of the first material layers (e.g., the insulator layers 32) in a first etch process employing a combination of the patterned trimming material layer 67 and the patterned hard mask layer 73 as an etch mask. Thus, at least one physically exposed portion of the topmost insulator layer 32 that is not covered by the patterned trimming material layer 67 or by the patterned hard mask layer 73 is etched. In one embodiment, the trimming material layer 67 can have a sidewall 67A that adjoins a top surface of a portion 73A among the multiple portions of the hard mask layer 73 during the first process step of the first set of process steps. The first etch process can be an anisotropic etch process that etches the first material of the first material layers (e.g., the insulator layers 32) selective to the second material of the second material layers (e.g., the sacrificial material layers 42). In one embodiment, the second material layers can be employed as etch stop layers for each first etch process. Specifically, the topmost second material layer (e.g., the topmost sacrificial material layer 42) can be employed as an etch stop layer for the first etch process of the first set of process steps. Throughout the duration of the first process step of the first set of process steps, the trimming material layer 67 can have a sidewall 67A that adjoins a top surface of a portion 73A among the multiple portions of the hard mask layer 73.

Figure 8:
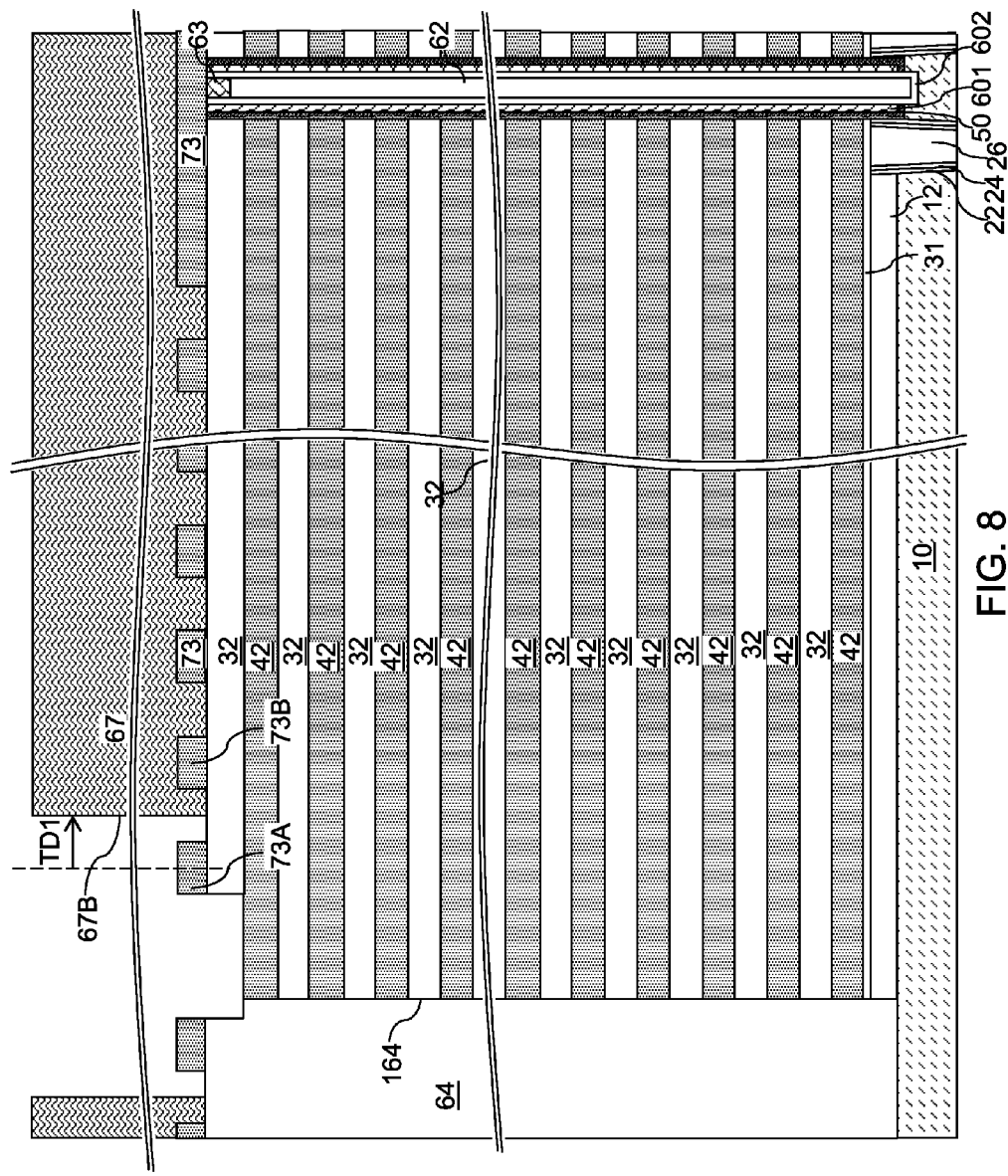
FIG. 8 is a vertical cross-sectional view of the exemplary structure after performing a second process step of the first set of process steps according to an embodiment of the present disclosure.

Referring to FIG. 8, a second process step of the first set of process steps can be performed. The second process step is a trimming step in which the trimming material layer 67 is trimmed selective to the materials of the first material layers (e.g., the insulator layers 32) and the second material layers (e.g., the sacrificial material layers 42). The trimming material layer 67 can be trimmed by an isotropic etch, which can be an isotropic dry etch or an isotropic wet etch. After the second process step, the trimming material layer 67 has a sidewall 67B that is located between, and does not contact, a neighboring pair of portions (73A, 73B) of the hard mask layer 73. In case the patterned portions of the hard mask layer 73 comprise a one-dimensional array having a pitch, the trimming distance for the second process step can be selected to be about one half of the pitch. The trimming distance is herein referred to as a first trimming distance TD1. In one embodiment, the sidewall 67B of the trimming material layer 67 can be shifted from above a first portion 73A of the hard mask layer 73 that is most proximal to the interface between the alternating stack (32, 42) and the dielectric material portion 64 to a location between the first portion 73A and a second portion 73B of the hard mask layer 73 that is a neighboring portion of the first portion 73A. In other words, the first portion 73A can be the most proximate portion to the interface 164 between the alternating stack (32, 42) and the dielectric material portion 64, and the second portion 73B can be a second most proximate portion to the interface 164 between the alternating stack (32, 42) and the dielectric material portion 64.

In one embodiment, the width of the patterned portion 73A (which is herein referred to as a first portion 73A) of the hard mask layer 73 on which an edge of the trimming material layer 67 is present at the end of the first process step can be at least twice the trimming width variation of the trimming material layer 67 (as manifested during the second process step). The spacing between the first portion 73A and a neighboring portion 73B of the hard mask layer 73 (which is herein referred to as a second portion 73B) can be at least twice the trimming width variation of the trimming material layer 67 (to be manifested during a fourth processing step to be subsequently performed). The center-to-center distance between the first portion and the second portion of the hard mask layer 73, or the pitch of the patterned portions of the hard mask layer 73, can be four times the trimming width variation of the trimming process plus the variance in critical dimension of a lithographic process employed to pattern the hard mask layer 73. In this case, the nominal value of the first trimming distance TD1 can be equal to twice the trimming width variation (which is the inherent variation in the trimming distance in a trimming process that trims the trimming material layer 67) plus one half of the variance in critical dimension of a lithographic process employed to pattern the hard mask layer 73. The target value for the first trimming distance TD1 can be modified from the nominal value by making an overlay measurement to determine the offset distance of a sidewall of the trimming material layer on the first portion of the hard mask layer with respect to an ideal position for the sidewall at the end of the first process step.

Figure 9:
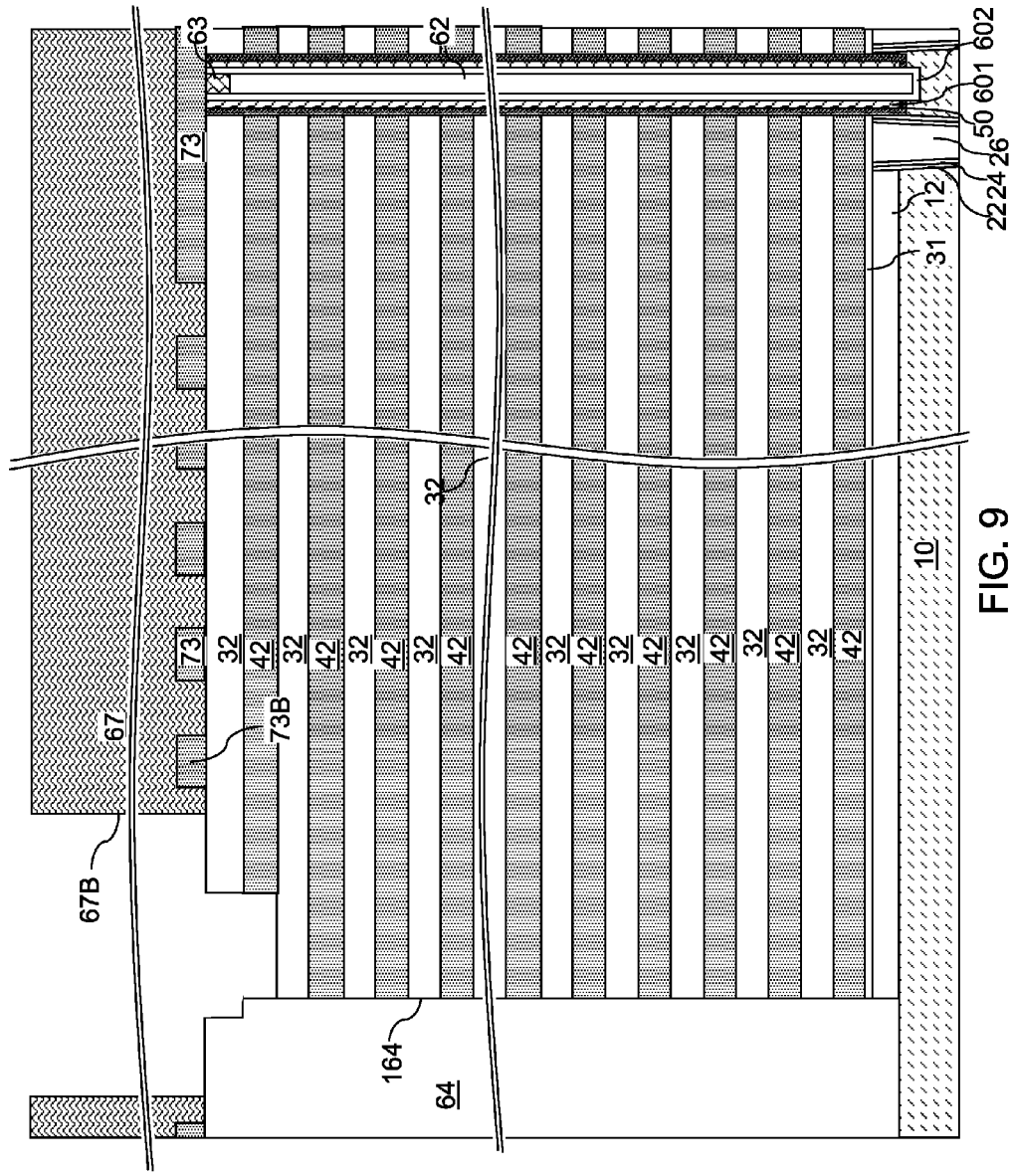
FIG. 9 is a vertical cross-sectional view of the exemplary structure after performing a third process step of the first set of process steps according to an embodiment of the present disclosure.

Referring to FIG. 9, a third process step of the first set of process steps is performed. The third process step is a step of etching at least one physically exposed portion of the second material layers (e.g., the sacrificial material layers 42) and at least one physically exposed portion 73A of the patterned hard mask layer 73 in a second etch process employing the trimming material layer 67 as an etch mask. The second etch process can be an anisotropic etch process that etches the second material of the second material layers and the material of the hard mask layer 73 selective to the first material of the first material layers. The first material layers are employed as etch stop layers for the second etch process. The first portion 73A of the hard mask layer 73 is removed during the third process step.

In one embodiment, at least one respective physically exposed portion of the second material layers (e.g., the sacrificial material layers 42) and at least one respective physically exposed portion 73A of the patterned hard mask layer 73 can be simultaneously etched in the third process step. In one embodiment, the hard mask layer 73 can comprise the same material as the second material layers. In one embodiment, the hard mask layer 73 and the second material layers can comprise silicon nitride, and the first material layers can comprise silicon oxide. In one embodiment, the hard mask layer 73 can have a thickness that is not greater than the maximum thickness of the second material layers so that each physically exposed portion of the hard mask layer 73 that is not covered by the trimming material layer 67 can be removed by the time each physically exposed portion of the second material layers (e.g., the sacrificial material layers 42) is etched through.

Figure 10:
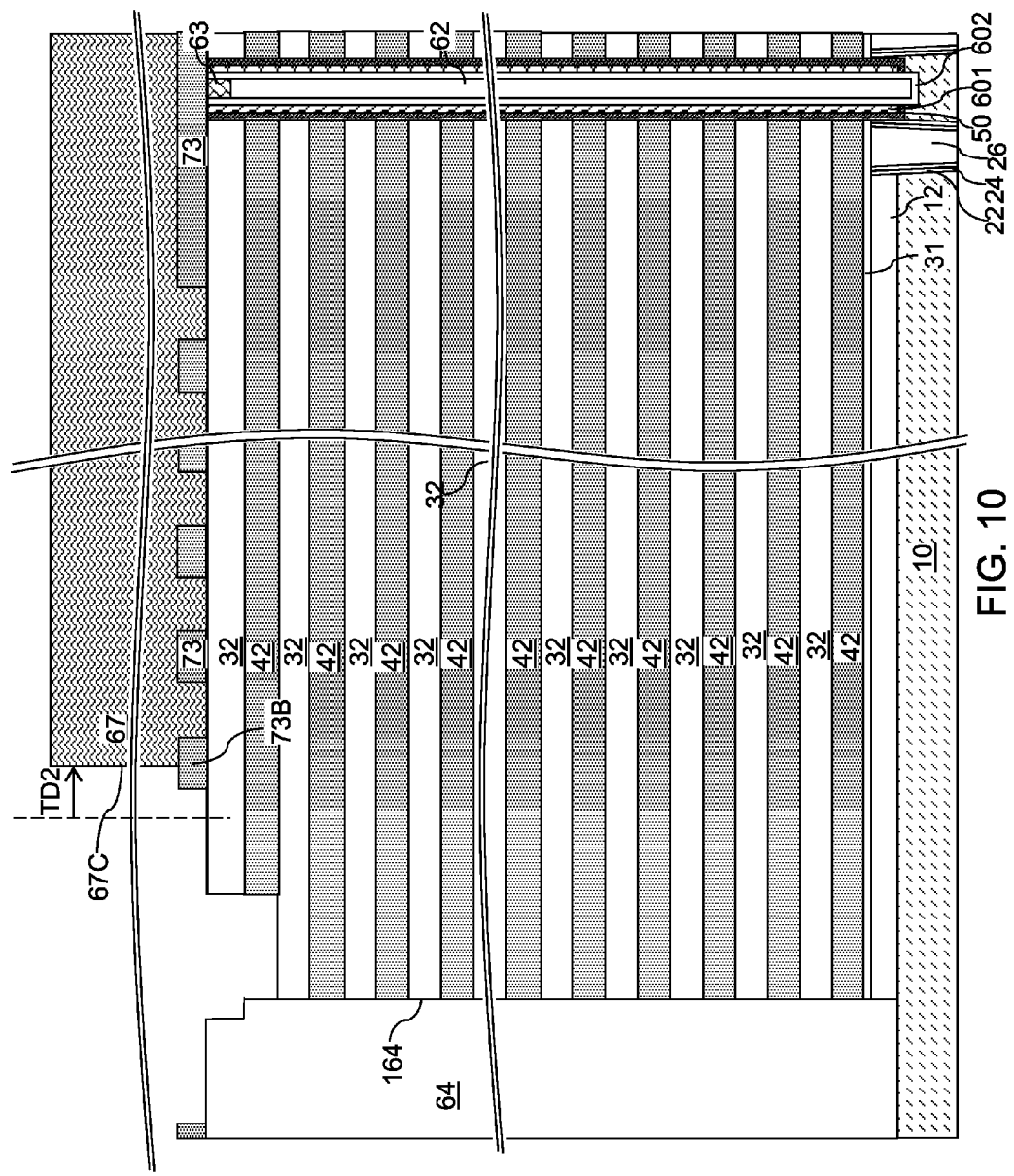
FIG. 10 is a vertical cross-sectional view of the exemplary structure after performing a fourth process step of the first set of process steps according to an embodiment of the present disclosure.

Referring to FIG. 10, a fourth process step of the first set of process steps is performed. The fourth process step is the step of further trimming the trimming material layer 67. The trimming material layer 67 can be trimmed selective to the materials of the first material layers (e.g., the insulator layers 32) and the second material layers (e.g., the sacrificial material layers 42) during the fourth process step. In one embodiment, the trimming material layer 67 can be trimmed by a second trimming distance TD2 such that a trimmed sidewall 67C of the trimming material layer 67 adjoins a top surface of a remaining portion 73B among the multiple portions of the hard mask layer 73 after the fourth process step. In a specific example, the remaining portion 73B of the hard mask layer 73 on which the trimmed sidewall of the trimming material layer 67 is formed can be the nearest neighboring portion of the portion 73A that is removed in the preceding third process step illustrated in FIG. 9. Thus, if a first portion 73A and a second portion 73B are neighboring portions of the hard mask layer 73 at the second process step (corresponding to FIG. 8), and if the first portion 73A is removed during the third process step (corresponding to FIG. 9), the sidewall 67C of the trimming material layer 73 can be shifted to the second portion 73B of the hard mask layer 73 during the fourth process step. In one embodiment, the sum of the first trimming distance TD1 and the second trimming distance TD2 can be about the center-to-center distance between neighboring portions (73A, 73B) of the hard mask layer 73. In one embodiment, a sidewall 67C of the trimming material layer 67 can straddle a center portion of the patterned portion 73B of the hard mask layer 73 that is most proximal to the interface 164 between the alternating stack (32, 42) and the dielectric material portion 64 among the portions of the hard mask layer 73 that overlie the alternating stack (32, 42).

In one embodiment, the width of a patterned portion (which is herein referred to as a first portion 73A) of the hard mask layer 73 on which an edge of the trimming material layer 67 is present at the end of the first process step can be at least twice the trimming width variation of the trimming material layer (as manifested during the second process step), and the spacing between the first portion 73A and a neighboring portion 73B of the hard mask layer 73 (which is herein referred to as a second portion) can be at least twice the trimming width variation of the trimming material layer 67 (to be manifested during a fourth processing step to be subsequently performed). The center-to-center distance between the first portion 73A and the second portion 73B of the hard mask layer 73, or the pitch of the patterned portions of the hard mask layer 73, can be four times the trimming width variation of the trimming process plus the variance in critical dimension of a lithographic process employed to pattern the hard mask layer 73. In this case, the nominal value of the first trimming distance TD1 can be equal to twice the trimming width variation (which is the inherent variation in the trimming distance in a trimming process that trims the trimming material layer 67) plus one half of the variance in critical dimension of a lithographic process employed to pattern the hard mask layer 73. The nominal value of the second trimming distance TD2 can be equal to twice the trimming width variation (which is the inherent variation in the trimming distance in a trimming process that trims the trimming material layer 67) plus one half of the variance in critical dimension of a lithographic process employed to pattern the hard mask layer 73. The target value for the second trimming distance TD2 can be modified from the nominal value by making an overlay measurement to determine the offset distance of a sidewall of the trimming material layer 67 with respect to an ideal position for the sidewall 67B at the end of the third processing step. The pitch of the patterned portions (73A, 73B) of the hard mask layer 73 may be the same as, or can be greater than, the sum of four times the trimming width variation and the variance in critical dimension of a lithographic process employed to pattern the hard mask layer 73.

The process steps of FIGS. 7-10 collectively constitute a set of process steps, which can be repeatedly performed to form stepped surfaces.

Figure 11:
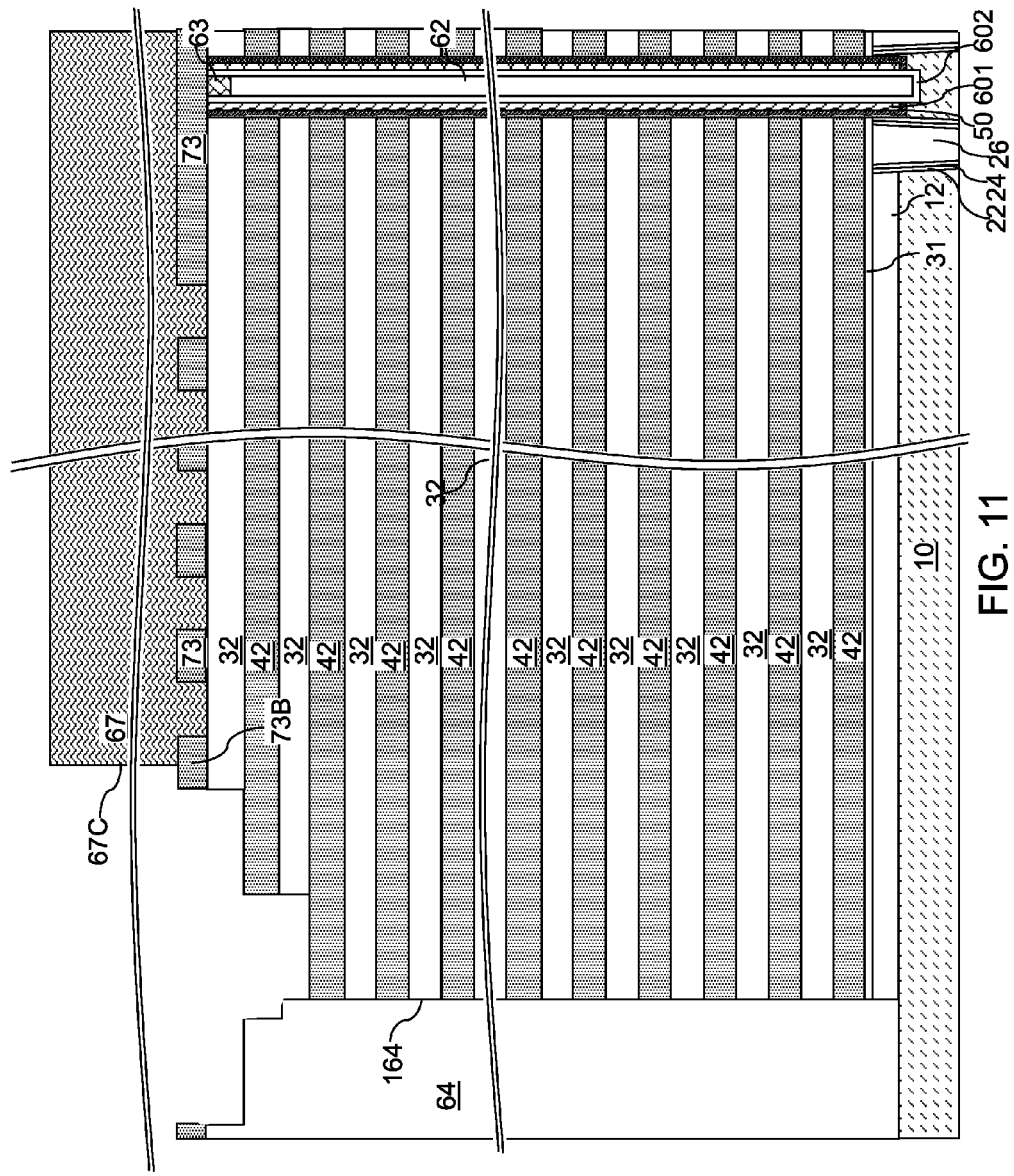
FIG. 11 is a vertical cross-sectional view of the exemplary structure after performing a first process step of a second set of process steps according to an embodiment of the present disclosure.

Referring to FIG. 11, a first process step of a second set of process steps can be performed. The second set of process steps can include an identical sequence of process steps as the first set of process steps. Specifically, the first process step of the second set of process steps can be identical to the first process step of the first set of process steps. Thus, physically exposed portions of the insulator layers 32 that are not covered by the patterned trimming material layer 67 or by the patterned hard mask layer 73 are etched. In one embodiment, the trimming material layer 67 can have a sidewall that adjoins a top surface of a remaining portion 73B among the multiple portions of the hard mask layer 73 during the first process step of the second set of process steps. The portions of the hard mask layer 73 that the sidewall of the trimming material layer 67 straddles can be the portion of the hard mask layer 73 that is the most proximate to the interface between the alternating stack (32, 42) and the dielectric material portion 64 among the remaining portions of the hard mask layer 73 that overlie the alternating stack (32, 42). The first etch process of the second set of process steps can be the same anisotropic etch process as the first etch process of the first set of process steps. In one embodiment, the second material layers can be employed as etch stop layers for each first etch process. During the first process step of the second set of process steps or any of the subsequent first process steps, the trimming material layer 67 can have a sidewall that adjoins, and straddles, a top surface of a remaining portion among the multiple portions of the hard mask layer 73.

Figure 12:
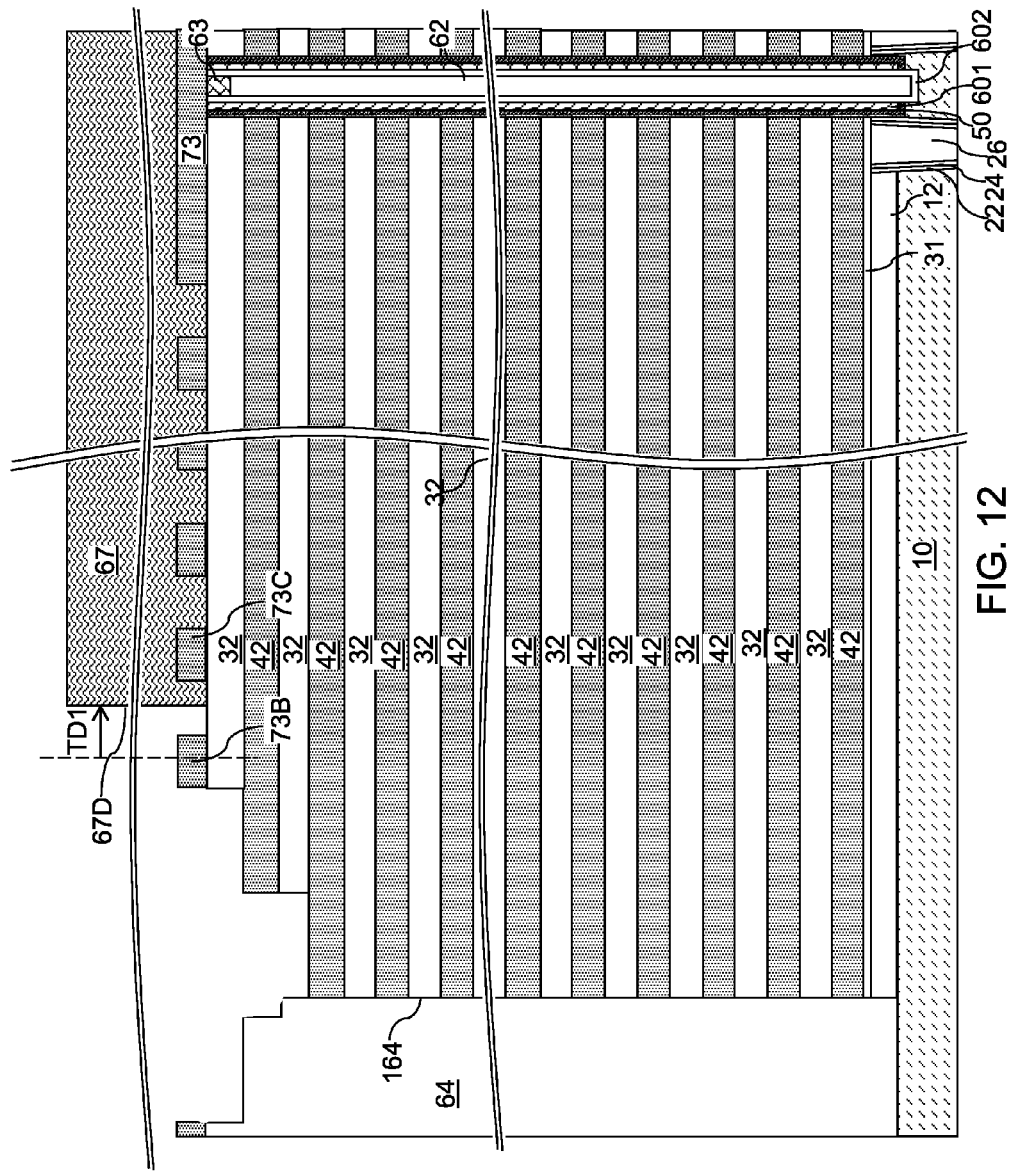
FIG. 12 is a vertical cross-sectional view of the exemplary structure after performing a second process step of the second set of process steps according to an embodiment of the present disclosure.

Referring to FIG. 12, the trimming material layer 67 can be trimmed in a second process step among the second set of process steps. The same trimming process can be employed as the second step of the first set of process steps. In one embodiment, the trimming distance can be the same as the first trimming distance TD1. In another embodiment, the trimming distance can be changed to match the center-to-center distance between two portions (73B, 73C) of the hard mask layer 73 that are most proximate to the interface 164 among the portions of the hard mask layer 73 that overlie the alternating stack (32, 42). In one embodiment, the sidewall 67D of the trimming material layer 67 can be shifted from above a first portion 73B of the hard mask layer 73 that is most proximal to the interface between the alternating stack (32, 42) and the dielectric material portion 64 among the remaining portions of the hard mask layer 73 that overlie the alternating stack (32, 42) to a location between the first portion 73B and a second portion 73C of the hard mask layer 73 that is a neighboring portion of the first portion 73B. In other words, the first portion 73B can be the most proximate portion to the interface 164 between the alternating stack (32, 42) and the dielectric material portion 64 among the remaining portions of the hard mask layer 73 that overlie the alternating stack (32, 42), and the second portion 73C can be a second most proximate portion to the interface between the alternating stack (32, 42) and the dielectric material portion 64 among the remaining portions of the hard mask layer 73 that overlie the alternating stack (32, 42).

Figure 13:
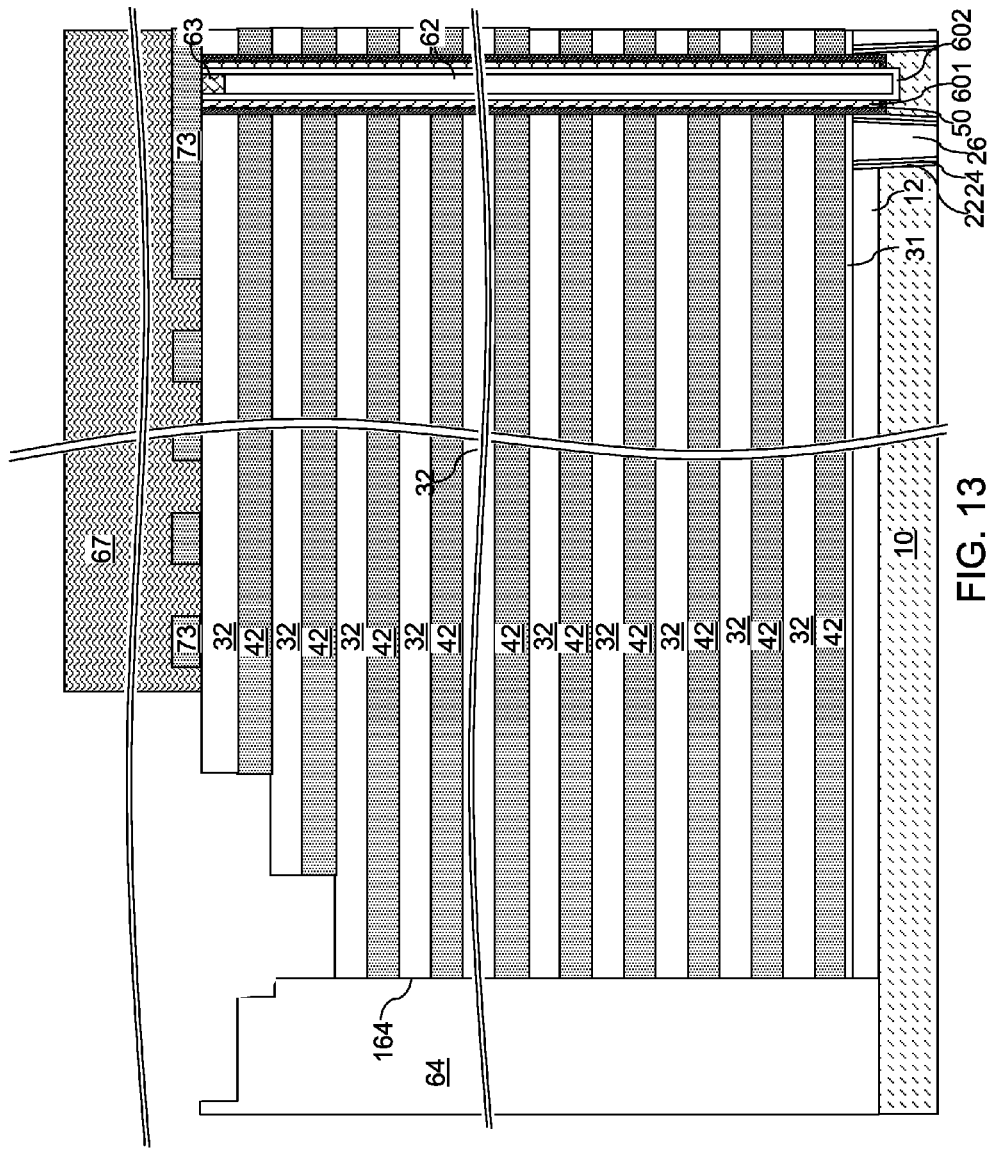
FIG. 13 is a vertical cross-sectional view of the exemplary structure after performing a third process step of the second set of process steps according to an embodiment of the present disclosure.

Referring to FIG. 13, a third process step of the second set of process steps is performed. The third process step of the second set of process steps can be the same as the third process step of the first set of process steps. Physically exposed portions of the second material layers (e.g., the sacrificial material layers 42) and at least one physically exposed portion 73B of the patterned hard mask layer 73 can be removed in an etch process employing the trimming material layer 67 as an etch mask. The etch process can be the same as the second etch process of the first set of process steps, which is an anisotropic etch process that etches the second material of the second material layers and the material of the hard mask layer 73 selective to the first material of the first material layers. The first material layers are employed as etch stop layers for the etch process. The remaining first portion 73B of the hard mask layer 73 is removed during the third process step.

In one embodiment, at least one respective physically exposed portion of the second material layers (e.g., the sacrificial material layers 42) and at least one respective physically exposed portion 73B of the patterned hard mask layer 73 can be simultaneously etched in the third process step of the second set of process steps.

Figure 14:
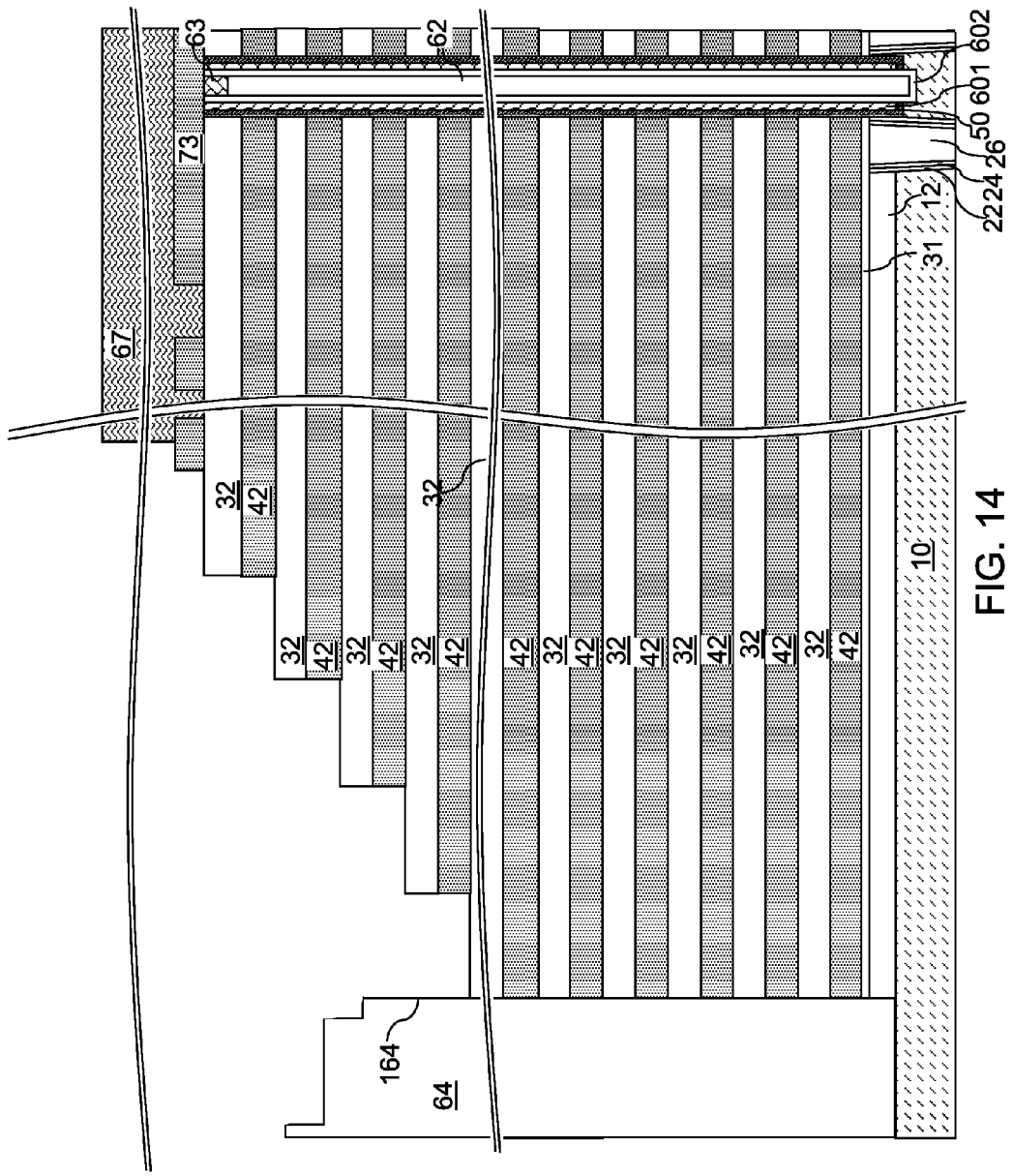
FIG. 14 is a vertical cross-sectional view of the exemplary structure after completion of four sets of process steps according to an embodiment of the present disclosure.

Referring to FIG. 14, the fourth process step of the second set of process steps can be performed. The fourth process step of the second set of process steps can be the same as the fourth process step of the first set of process steps.

Subsequently, the set of process steps can be repeatedly performed, which includes a first process step (which can be the same as the first process step of the first set of process steps), a second process step (which can be the same as the second process step of the first set of process steps), a third process step (which can be the same as the third process step of the first set of process steps), and a fourth process step (which can be the same as the fourth process step of the first set of process steps). FIG. 14 illustrates the exemplary structure after completion of four sets of process steps.

Figure 15:
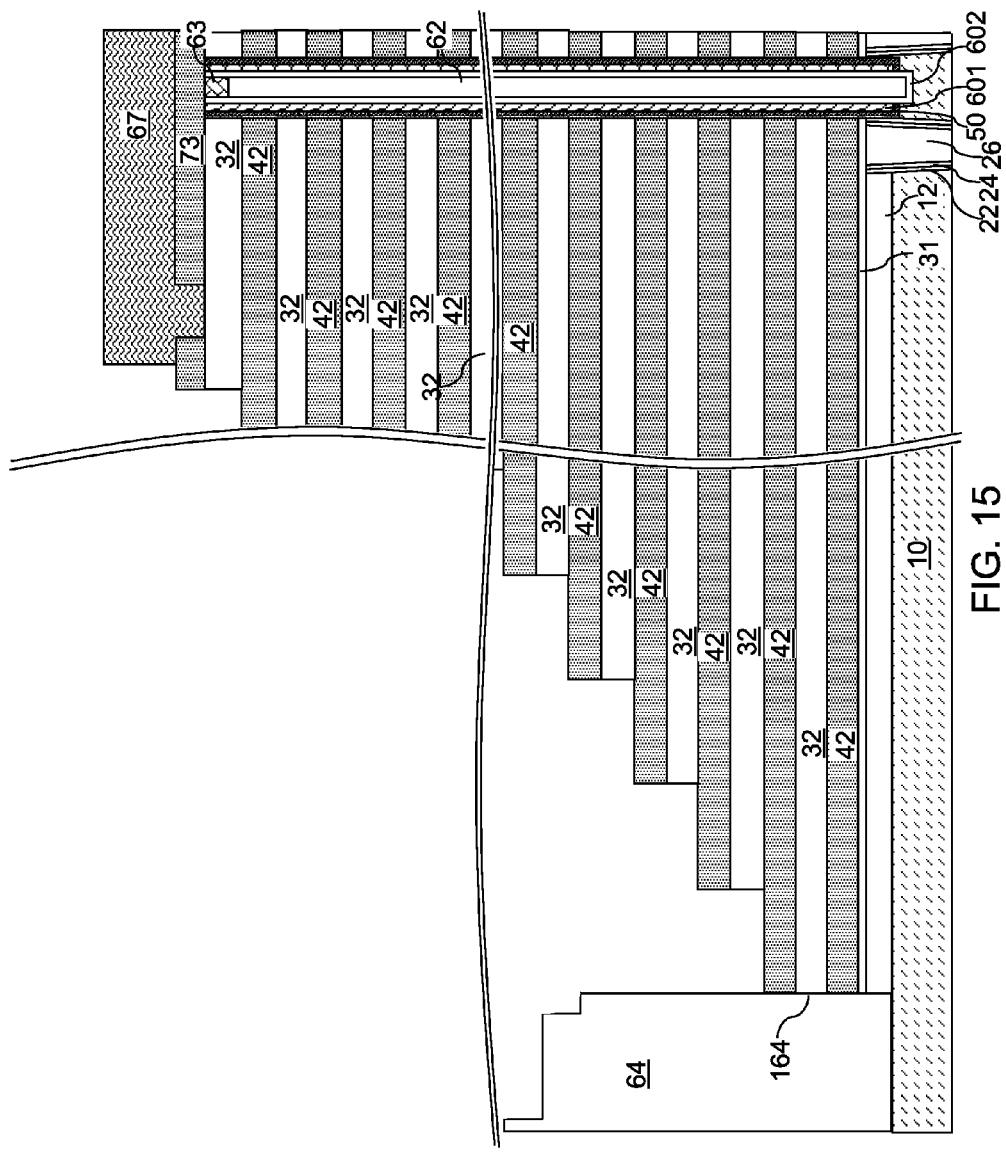
FIG. 15 is a vertical cross-sectional view of the exemplary structure after completion of a first process step of the (n−1)-th set of process steps according to an embodiment of the present disclosure, in which n is the total number of sacrificial material layers to be exposed after formation of a set of stepped surfaces.

Referring to FIG. 15, the set of process steps can further be repeatedly performed. FIG. 15 illustrates the exemplary structure after completion of the first process step of the (n−1)-th set of process steps, in which n is the total number of sacrificial material layers 42 to be exposed after formation of a set of stepped surfaces.

Figure 16:
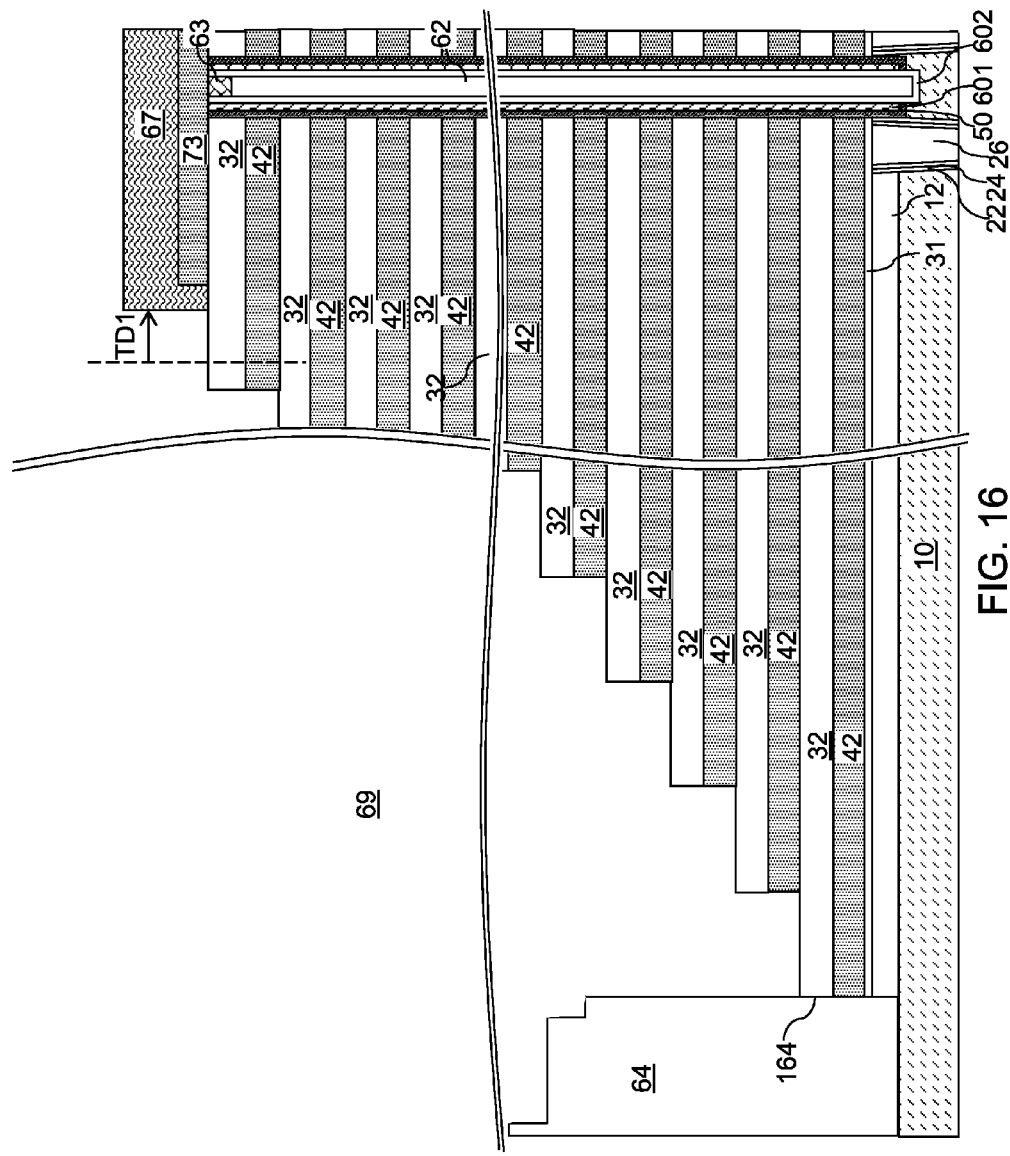
FIG. 16 is a vertical cross-sectional view of the exemplary structure after completion of a third process step of the (n−1)-th set of process steps according to an embodiment of the present disclosure.

Referring to FIG. 16, the second and third process steps of the (n−1)-th set of process steps can be performed to laterally recess the trimming material layer 67, for example, by the first trimming distance TD1, and to remove physically exposed portions of the sacrificial material layers 42. A set of stepped surfaces can be formed underneath a stepped cavity 69. The set of stepped surfaces includes a top surface of each insulator layer 32 (including the topmost insulator layer 32 and bottommost insulator layer 32 which is the n-th insulator layer from the top) and vertical surfaces of each material layer within the alternating stack (32, 42) except the bottommost insulator layer 32 and the bottommost sacrificial material layer 42.

As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

Figure 17:
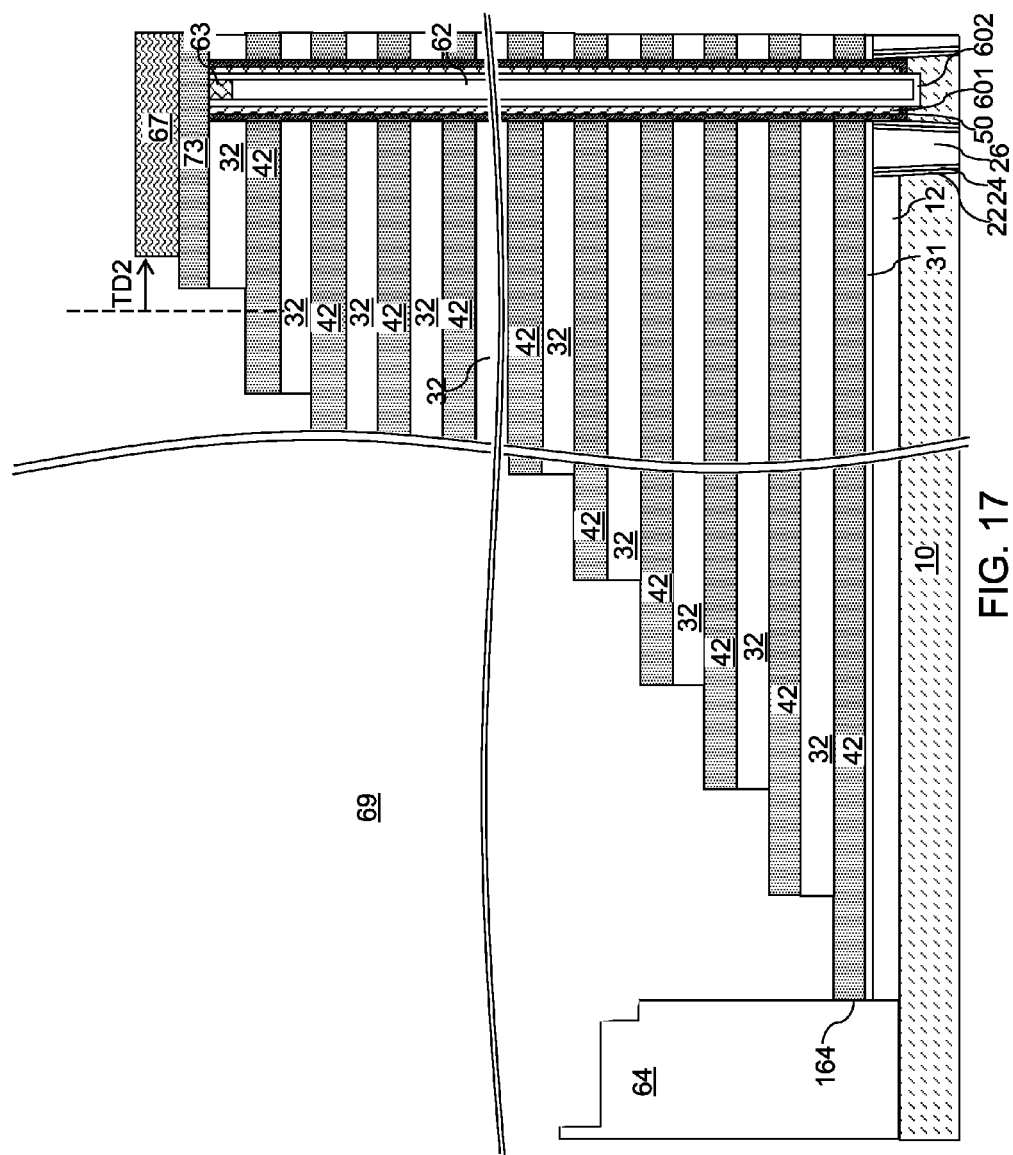
FIG. 17 is a vertical cross-sectional view of the exemplary structure after completion of a fourth process step of the (n−1)t-th set of process steps and an anisotropic etch process that removes physically exposed portions of the first material layers according to an embodiment of the present disclosure.

Referring to FIG. 17, the fourth process step of the (n−1)-th set of process steps is formed to trim the trimming material layer 67, for example, by the second trimming distance TD2.

Subsequently, an anisotropic etch process is performed, which removes physically exposed portions of the first material layers (e.g., the insulator layers 32) employing the combination of the trimming material layer 67 and the second material layers (e.g., the sacrificial material layers 42) as an etch mask. In one embodiment, the anisotropic etch can employ the same chemistry as the first anisotropic etch in the first process step of the first set of process steps. The remaining portion of the first material layers and second material layers constitute a stepped structure in which each overlying layer in the stack (32, 42) does not protrude in a direction parallel to a top surface of the substrate (9, 10) (i.e., in a horizontal direction) more than any underlying layer in the stack (32, 42). A stepped cavity 69 is formed over the stepped surfaces of the alternating stack (32, 42).

In one embodiment, if neighboring pairs of patterned multiple portions of the hard mask layer 73 have at least two different center-to-center distances, and if the patterned multiple portions of the hard mask layer 73 have at least two different widths immediately after patterning of the hard mask layer 73, a plurality of steps in the stepped structure can have at least two different step widths. Alternatively, if the center-to-center distance between each neighboring pair of patterned multiple portions of the hard mask layer 73 is the same, and if the patterned multiple portions of the hard mask layer 73 constitutes a periodic one-dimensional array having a repetition of a unit pattern after patterning of the hard mask layer 73, then the plurality of steps in the stepped structure can have the same step widths.

Figure 18:
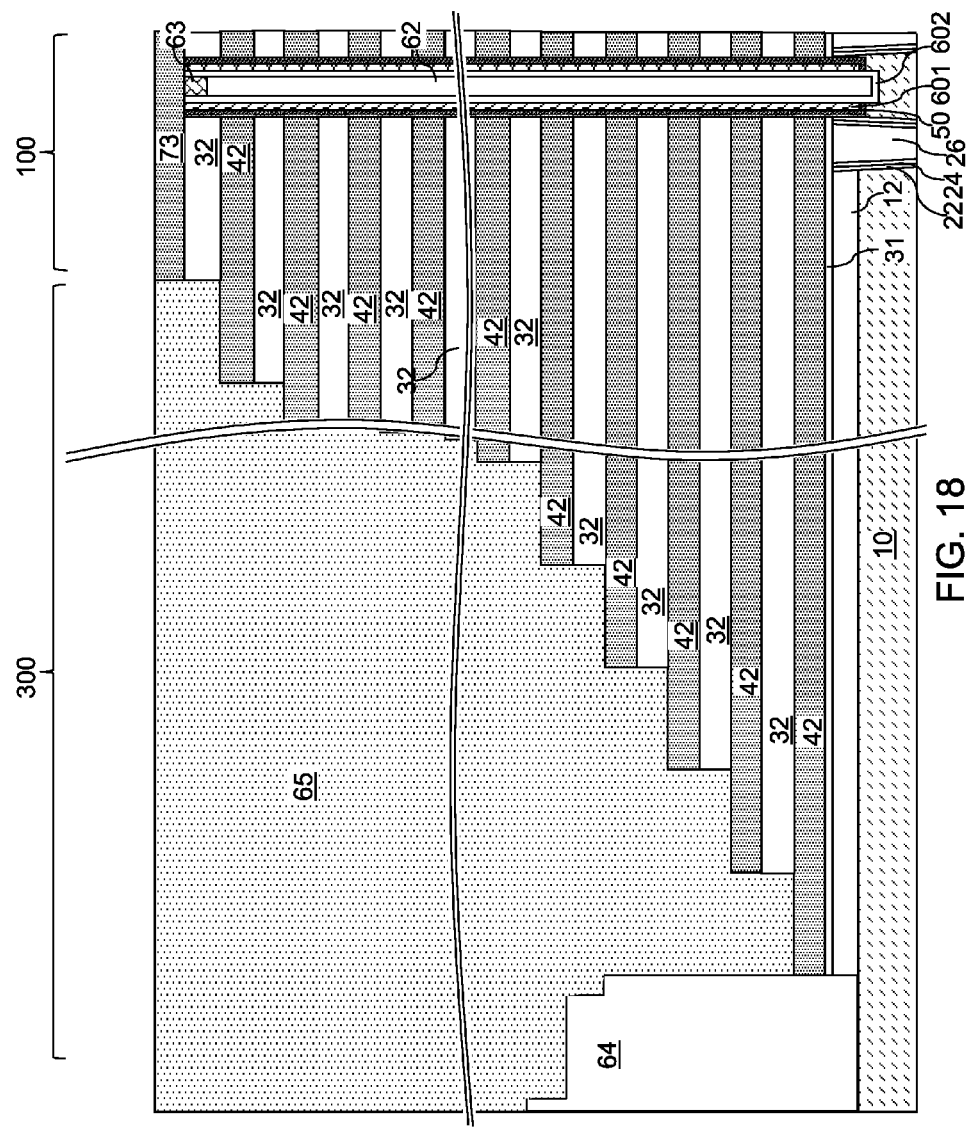
FIG. 18 is a vertical cross-sectional view of the exemplary structure after formation of retro-stepped dielectric material portion according to an embodiment of the present disclosure.

Referring to FIG. 18, a dielectric material portion (i.e., insulating fill material portion) can be formed in the stepped cavity 69 by deposition of a dielectric material therein. A dielectric material such as silicon oxide can be deposited in the stepped cavity 69. Excess portions of the deposited dielectric material can be removed from above the top surface of the hard mask layer 73, for example, by chemical mechanical planarization (CMP). The remaining portion of the deposited dielectric material filling the stepped cavity 69 constitutes the dielectric material portion.

The dielectric material portion is retro-stepped, and is herein referred to as a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. The retro-stepped dielectric material portion 65 is formed over the stepped structure of the alternating stack (32, 42), and can have a planar top surface. If silicon oxide is employed for the retro-stepped dielectric material portion 65, the silicon oxide of the retro-stepped dielectric material portion 65 may, or may not, be doped with dopants such as B, P, and/or F.

Figure 19:
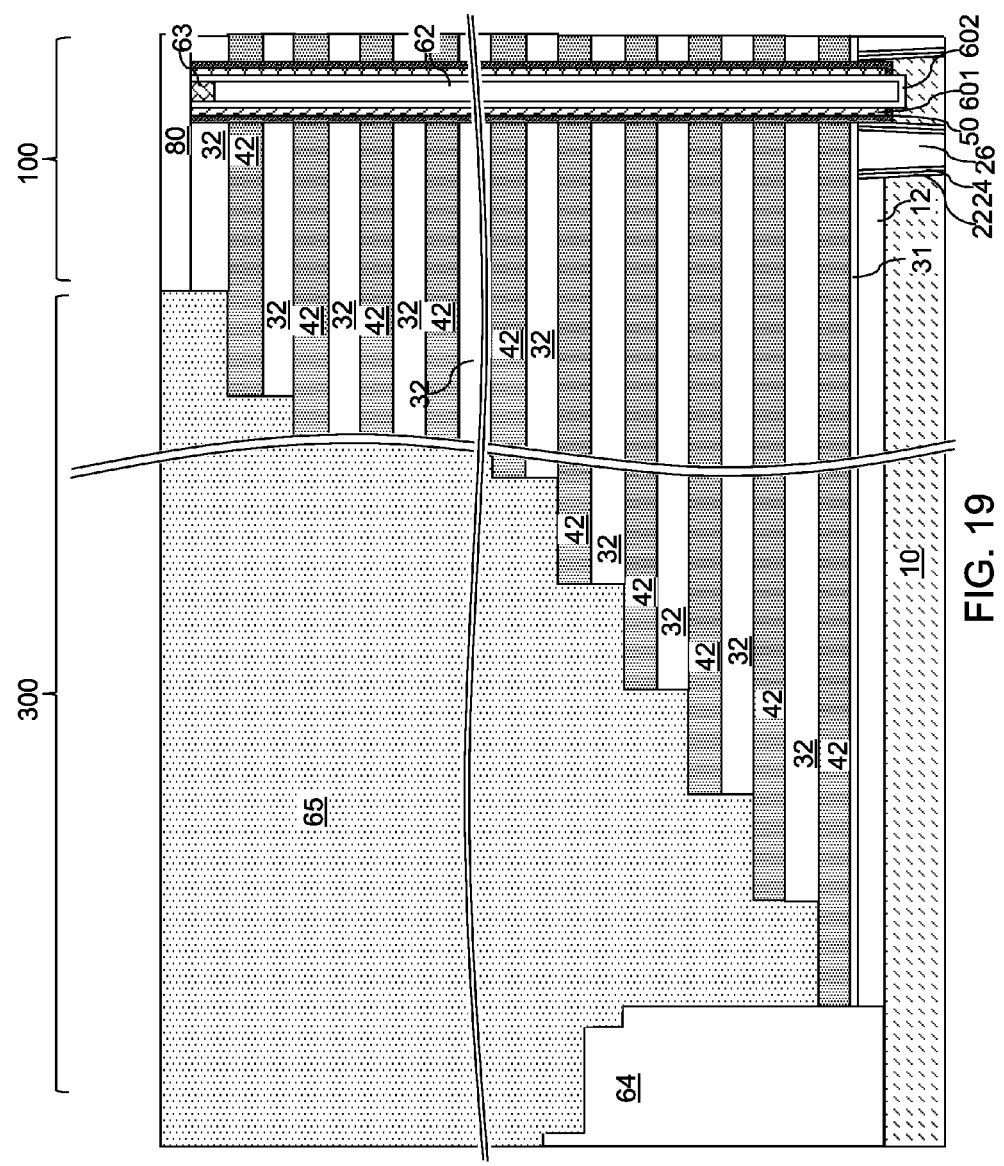
FIG. 19 is a vertical cross-sectional view of the exemplary structure after replacement of the hard mask layer with a dielectric cap layer according to an embodiment of the present disclosure.

Referring to FIG. 19, the hard mask layer 73 can be optionally replaced with a dielectric cap layer 80. The hard mask layer 73 can be removed, for example, by a wet etch process that is selective to the dielectric material of the retro-stepped dielectric material portion 65. The dielectric cap layer 80 can include a dielectric material that is different from the material of the sacrificial material layers 42. In one embodiment, the dielectric material layer 80 can include silicon oxide. The dielectric cap layer 80 may, or may not, be planarized. Depending on whether the dielectric cap layer 80 is planarized or not, the dielectric cap layer 80 can be formed only in the region(s) from which a remaining portion of the hard mask layer 73 at the process step of FIG. 18 is removed, or can be formed in the device region 100 and in the contact region 300.

Figure 20:
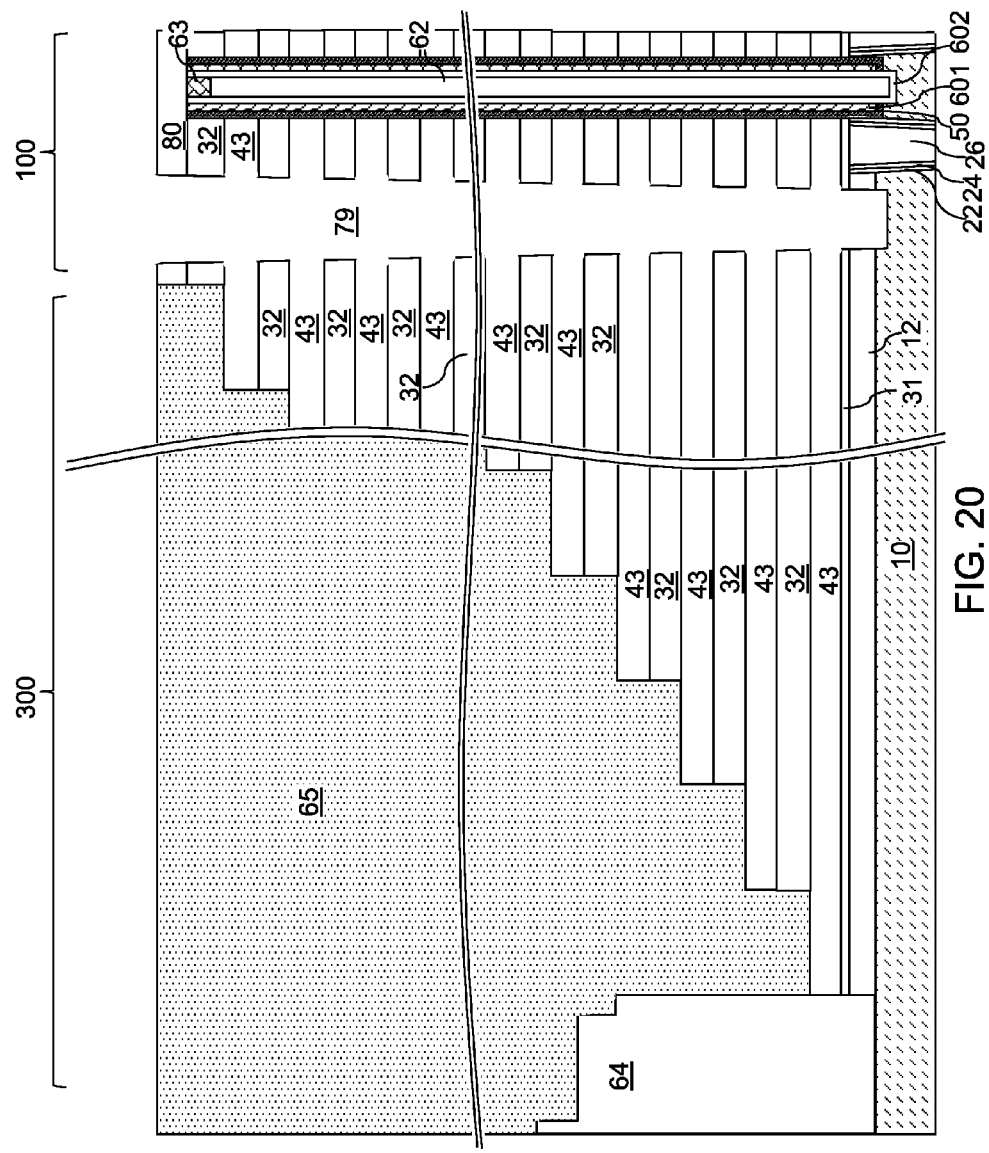
FIG. 20 is a vertical cross-sectional view of the exemplary structure after formation of a backside contact trench and backside recesses according to an embodiment of the present disclosure.

Referring to FIG. 20, at least one dielectric support pillar (not shown) may be optionally formed through the retro-stepped dielectric material portion 65 and/or through the alternating stack (32, 42). A photoresist layer (not shown) can be applied over the alternating stack (32, 42) and/or the retro-stepped dielectric material portion 65, and lithographically patterned to form at least one backside contact trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed. If desired, a source region (not shown) may be formed by implantation of dopant atoms into a portion of the substrate semiconductor layer 10 through the backside contact trench 79.

An etchant that selectively etches the second material of the sacrificial material layers 42 with respect to the first material of the insulator layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulator layers 32, the material of the at least one dielectric support pillar 7P, the material of the retro-stepped dielectric material portion 65, the semiconductor material of the substrate semiconductor layer 10, and the material of the outermost layer of the memory films 50. In one embodiment, the sacrificial material layers 42 can include silicon nitride, and the materials of the insulator layers 32, the at least one dielectric support pillar (if present), and the retro-stepped dielectric material portion 65 can be selected from silicon oxide and dielectric metal oxides. In another embodiment, the sacrificial material layers 42 can include a semiconductor material such as polysilicon, and the materials of the insulator layers 32, the at least one dielectric support pillar (if present), and the retro-stepped dielectric material portion 65 can be selected from silicon oxide, silicon nitride, and dielectric metal oxides. In this case, the depth of the at least one backside contact trench 79 can be modified so that the bottommost surface of the at least one backside contact trench 79 is located within the dielectric pad layer 12, i.e., to avoid physical exposure of the top surface of the semiconductor substrate layer 10 until after formation of electrically conductive layers.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar (if present), the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region comprises an array of monolithic three dimensional NAND strings having a plurality of device levels disposed above the substrate (9, 10). In this case, each backside recess 43 can define a space for receiving a respective word line of the array of monolithic three dimensional NAND strings.

Each of the plurality of backside recesses 43 can extend substantially parallel to the top surface of the substrate (9, 10). A backside recess 43 can be vertically bounded by a top surface of an underlying insulator layer 32 and a bottom surface of an overlying insulator layer 32. In one embodiment, each backside recess 43 can have a uniform height throughout.

Figure 21:
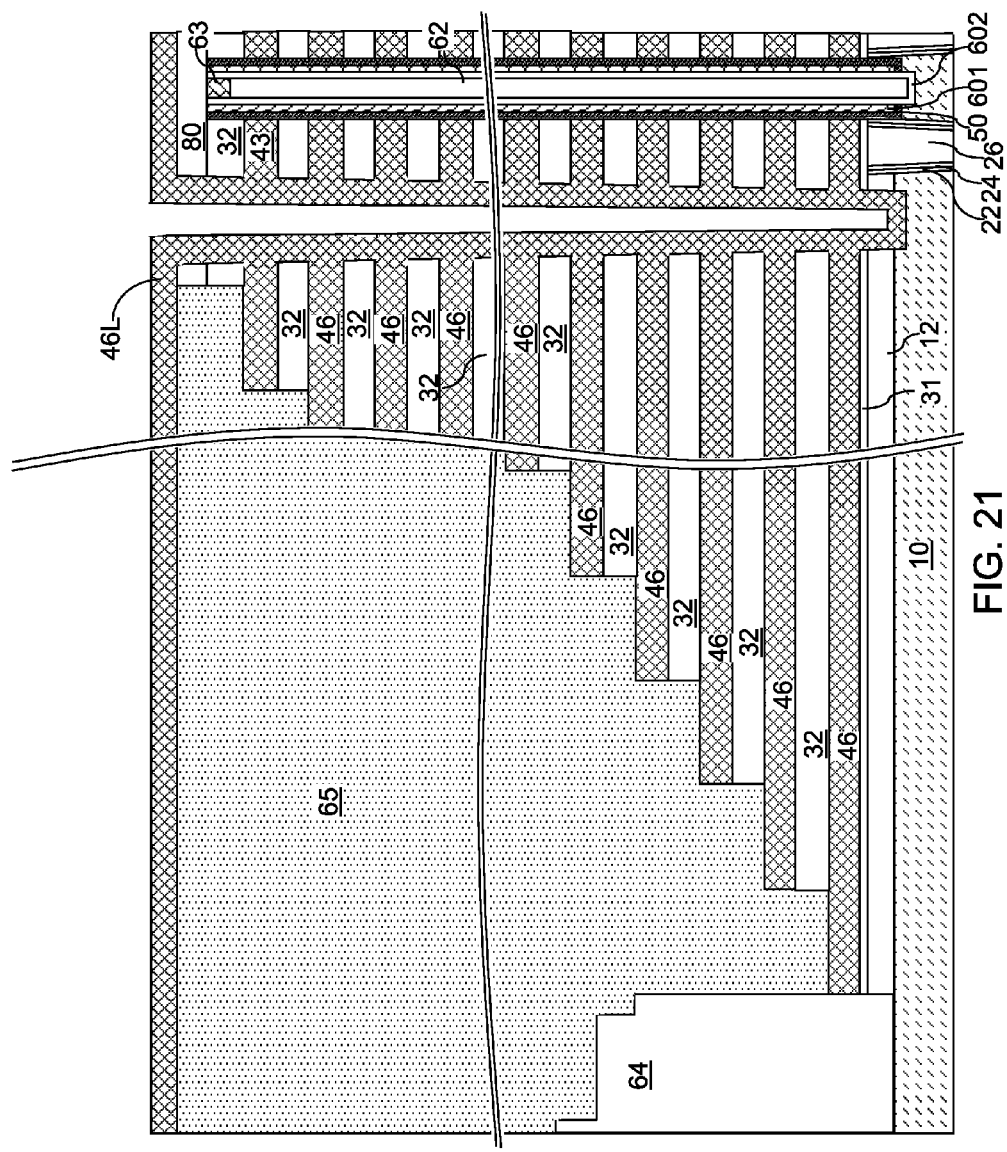
FIG. 21 is a vertical cross-sectional view of the exemplary structure after formation of electrically conductive layers according to an embodiment of the present disclosure.

Referring to FIG. 21, a conductive material can be deposited in the plurality of backside recesses 43, on sidewalls of the at least one the backside contact trench 79, and over the retro-stepped dielectric material portion 65 and the dielectric cap layer 80. As used herein, a conductive material refers to an electrically conductive material. The conductive material can be deposited by a conformal deposition method, which can be, for example, chemical vapor deposition (CVD), atomic layer deposition (ALD), electroless plating, electroplating, or a combination thereof. The conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary conductive materials that can be deposited in the plurality of backside recesses 43 include tungsten, tungsten nitride, titanium, titanium nitride, tantalum, and tantalum nitride. In one embodiment, the conductive material can comprise a metal such as tungsten and/or metal nitride. In one embodiment, the conductive material for filling the plurality of backside recesses 43 can be selected from tungsten and a combination of titanium nitride and tungsten. In one embodiment, the conductive material can be deposited by chemical vapor deposition. A plurality of electrically conductive layers 46 is formed in the backside recesses 43.

Figure 22:
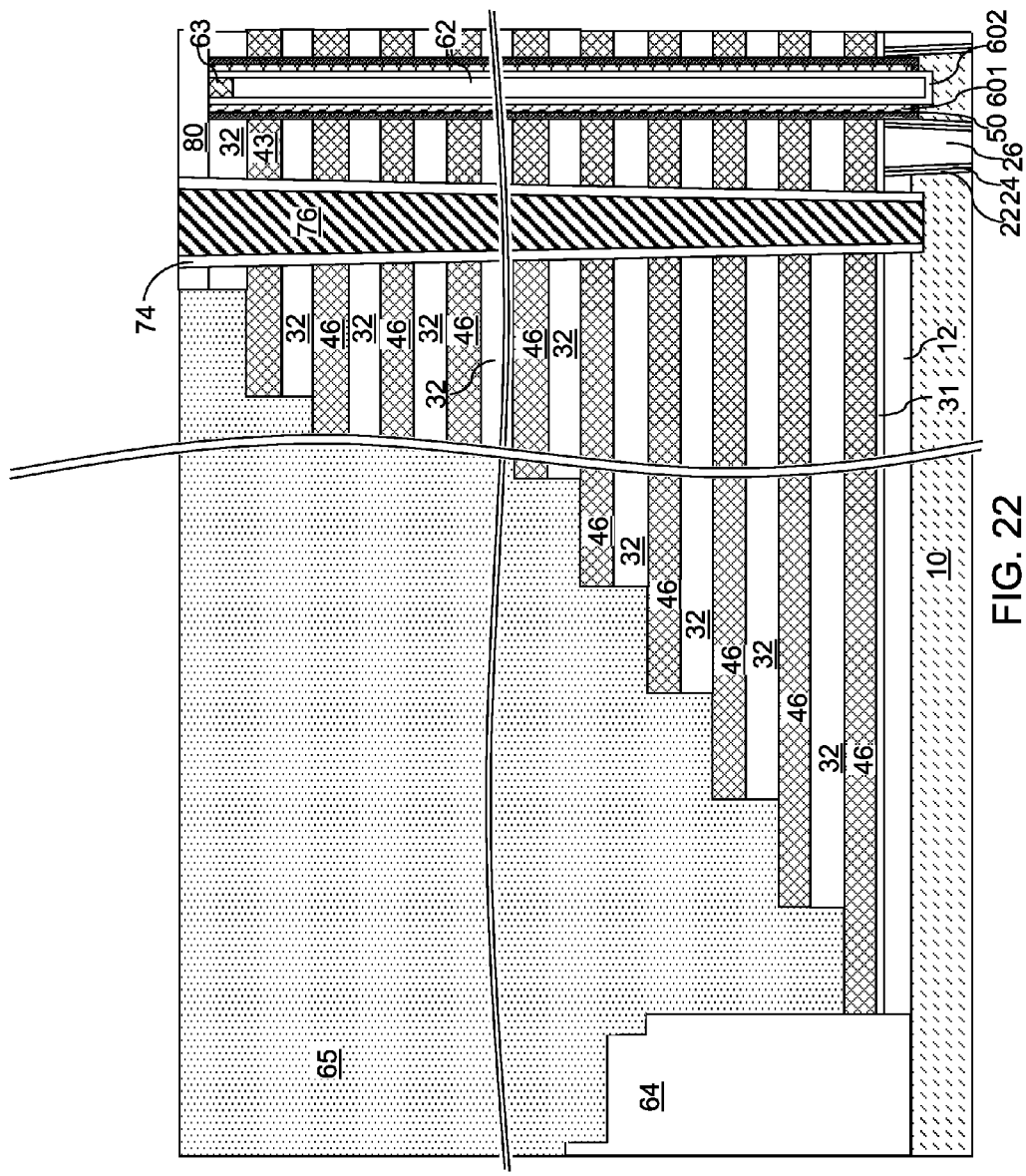
FIG. 22 is a vertical cross-sectional view of the exemplary structure after formation of a backside contact via structure according to an embodiment of the present disclosure.

Referring to FIG. 22, the deposited conductive material can be etched back from the sidewalls of each backside contact trench 79 and from above the retro-stepped dielectric material portion 65 and the dielectric cap layer 80. Each electrically conductive layer 46, which is located outside the volume of the backside contact cavity, can remain in its respective level. The electrically conductive layers 46 can include at least control gate level electrically conductive layers, which function as a combination of a plurality of control gate electrodes and a word line electrically connecting, i.e., electrically shorting, the plurality of control gate electrodes. Each control gate level electrically conductive layer can be a word line that functions as a common control gate electrode for the plurality of vertical memory devices.

An insulating spacer 74 can be formed on the sidewalls of the backside contact trench 79 by deposition of a contiguous dielectric material layer and an anisotropic etch of its horizontal portions. The insulating spacer 74 includes a dielectric material, which can comprise, for example, silicon oxide, silicon nitride, a dielectric metal oxide, a dielectric metal oxynitride, or a combination thereof. The thickness of the insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

A conductive material can be deposited within the cavity surrounded by the insulating spacer 74 to fill the cavity. The deposited conductive material can be removed from above the topmost layer of the exemplary structure (which can be, for example, the dielectric pillar material layer 73) by a planarization process, which can be, for example, a chemical mechanical planarization (CMP) process. The remaining portion of the conductive material below the topmost layer of the exemplary structure and within the insulating spacer 74 constitutes a backside contact via structure 76. The backside contact via structure 76 can be a source line that extends through a dielectric insulated trench, i.e., the backside contact trench 79 filled with the dielectric spacer 74 and the backside contact via structure 76, in the stack to electrically contact a source region (not shown) within the substrate (9, 10). The source region can be in contact with the horizontal portion of the semiconductor channel in an upper portion of the substrate semiconductor layer 10.

Prior to, concurrently with, or after, formation of the backside contact via structure 76 by deposition and planarization of a conductive material, contact via structures contacting the electrically conductive layers 46 can be formed.

Figure 23:
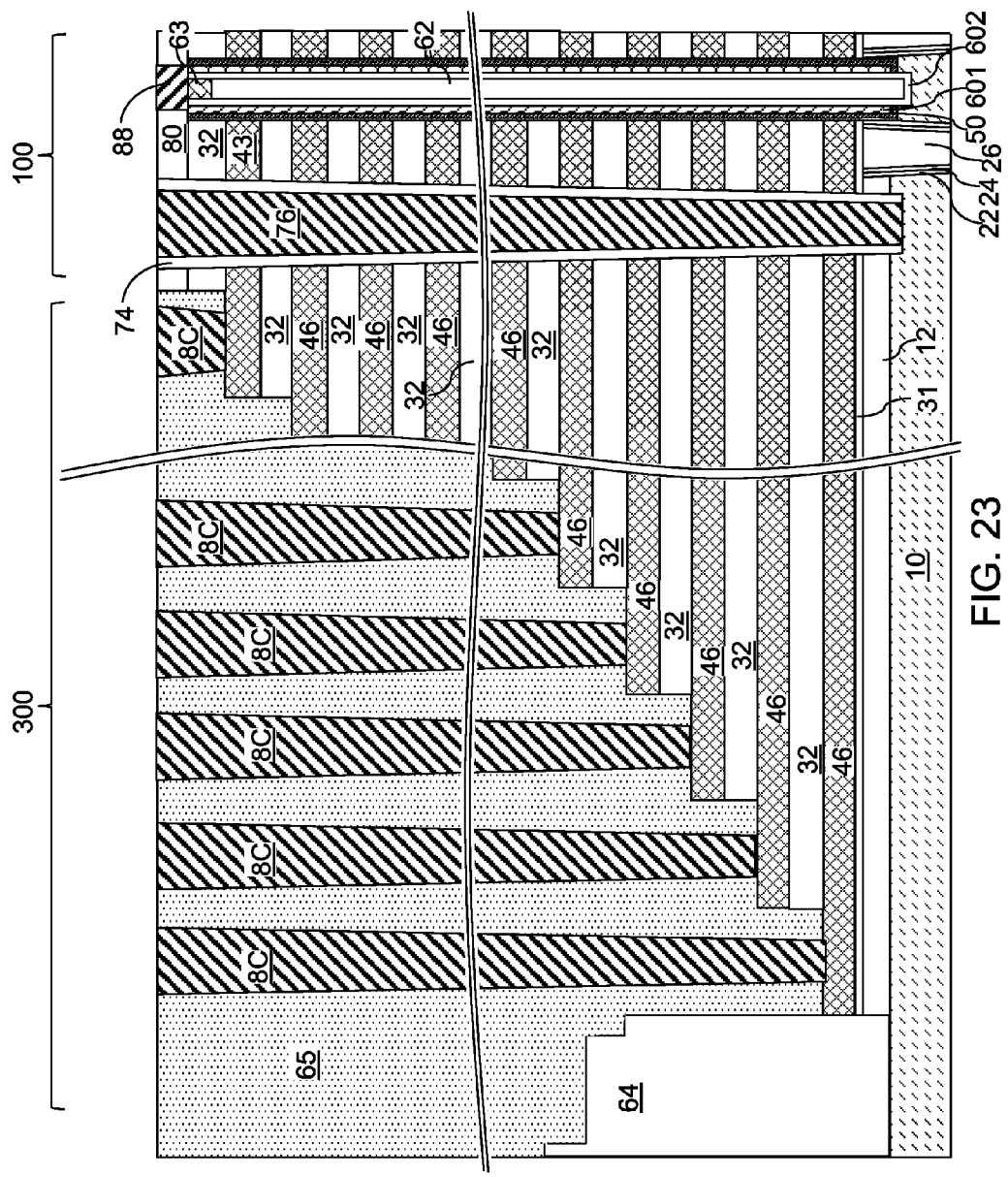
FIG. 23 is a vertical cross-sectional view of the exemplary structure after formation of control gate contact via structures according to an embodiment of the present disclosure.

Referring to FIG. 23, a photoresist layer (not shown) can be applied over the topmost layer of the exemplary structure (which can be, for example, the dielectric cap layer 80), and can be lithographically patterned to form opening therein.

In one embodiment, the locations and sizes of the openings through the photoresist layer can be selected such that a plurality of openings is formed in the contact region 300 so that each area of the opening is entirely within an area of a top surface of an electrically conductive layer 46 that contacts the retro-stepped dielectric material portion 65. In one embodiment, the shapes of the openings in the contact region 300 can be substantially circular or substantially elliptical. In one embodiment, the plurality of openings in the contact region 300 can be arranged as a linear array or an m×n two-dimensional rectangular array in which m is a positive integer, and n is the total number of levels of the electrically conductive layers 46. Additional openings can be formed over each drain region 63 in the device region 100

The pattern in the photoresist layer can be transferred through the retro-stepped dielectric material portion 65 or through the dielectric cap layer 80 by an anisotropic etch to form via cavities that extend from the top surface of the retro-stepped dielectric material portion 65 to the top surface of a respective electrically conductive layer 46 or from the top surface of the dielectric cap layer 80 to the top surface of a respective drain region 63. At least one conductive material is deposited in the via cavities, and excess portions of the at least one conductive material can be removed from above the top surface of the retro-stepped dielectric material portion 65 and from above the top surface of the dielectric cap layer 80. Contact via structures 8C are formed in the contact region 300. The contact via structures 8C contact the top surface of a respective electrically conductive layer 46, and are herein referred to as control gate contact via structures. Drain contact via structures 88 can be formed, which contact the top surface of a respective drain region 63.

The plurality of contact via structures 8C can have different heights through the retro-stepped dielectric material portion 65. In one embodiment, the plurality of contact via structures 8C can have top surfaces located within a same horizontal plane, which can be the horizontal plane including the top surface of the retro-stepped dielectric material layer 65. Each of the plurality of contact via structures 8C can be formed directly on a top surface of a respective electrically conductive layer 46. The plurality of contact via structures 8C can comprise control gate contact via structures that contact respective electrically conductive layers 46 within the subset of electrically conductive layers 46.

The backside contact via structure 76 can be a source line that extends through a dielectric insulated trench, i.e., the backside contact trench 79 filled with the dielectric spacer 74 and the backside contact via structure 76, in the stack to electrically contact the source region (not shown). The source region can be in contact with the horizontal portion of the semiconductor channel in an upper portion of the semiconductor material layer 10. An array of drain regions 63 contacts a respective semiconductor channel (601, 602) within the array of memory stack structures 55. A top surface of the dielectric material layer, i.e., the insulator cap layer 70, can be coplanar with top surfaces of the drain regions 63. A drain line, as embodied as a conductive line structure that contacts a drain contact via structure, can electrically contact an upper portion of the semiconductor channel (601, 602). As used herein, a first element "electrically contacts" a second element if the first element is electrically shorted to the second element.

A subset of the electrically conductive layers 46 comprises control gate electrodes for the at least one memory stack structure 55. Optionally, one or more of the electrically conductive layers 46 can comprise select gate electrodes located above, or underneath, the control gate electrodes. For example, electrically conductive layers 46 located at the lowest level(s) can comprise lower level select gate electrodes located below the control gate electrodes. In this case, the lower level electrically conductive layer(s) 46 can comprise source select gate electrodes, which can be employed to select a semiconductor channel (601, 602) to be activated from the source side. Electrically conductive layers 46 located at the highest level(s) can comprise upper level select gate electrodes located above the control gate electrodes. In this case, the upper level electrically conductive layer(s) 46 can comprise drain select gate electrodes, which can be employed to select a semiconductor channel (601, 602) to be activated from the drain side.

In one embodiment, the device located over the semiconductor substrate can include a vertical NAND device located in the device region, and at least one of the electrically conductive layers 46 in the stack (32, 46) can comprise, or can be electrically connected to, a word line of the NAND device. The device region can include a plurality of semiconductor channels (601, 602). At least one end portion of each of the plurality of semiconductor channels (601, 602) extends substantially perpendicular to a top surface of the semiconductor substrate. The device region further includes a plurality of charge storage regions located within each memory layer 50. Each charge storage region is located adjacent to a respective one of the plurality of semiconductor channels (601, 602). The device region further includes a plurality of control gate electrodes having a strip shape extending substantially parallel to the top surface of the substrate (9, 10). The plurality of control gate electrodes comprise at least a first control gate electrode located in the first device level and a second control gate electrode located in the second device level. The plurality of electrically conductive layers 46 in the stack (32, 45) can be in electrical contact with, or can comprise, the plurality of control gate electrodes, and extends from the device region to a contact region including a plurality of electrically conductive contact via structures.

In case the exemplary structure includes a three-dimensional NAND device, a stack (32, 45) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An array of memory stack structures 55 is embedded within the stack (32, 45). Each memory stack structure 55 comprises a semiconductor channel (601, 602) and at least one charge storage region located adjacent to the semiconductor channel (601, 602). At least one end portion of the semiconductor channel (601, 602) extends substantially perpendicular to the top surface of the semiconductor substrate through the stack (32, 45).

In a non-limiting illustrative example, the insulating layers 32 can comprise silicon oxide layers, the plurality of word lines 46 can comprise tungsten or a combination of titanium nitride and tungsten, the memory film 50 can comprises a tunneling dielectric, a blocking dielectric layer, and either a plurality of floating gates or a charge trapping layer located between the tunneling dielectric layer and the blocking dielectric layer. An end portion of each of the plurality of word lines 46 in a device region can comprise a control gate electrode located adjacent to the at least one charge storage region. A plurality of contact via structures contacting the word lines 46 can be located in a contact region. The plurality of word lines 46 extends from the device region to the contact region.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. All of the publications, patent applications and patents cited herein are incorporated herein by reference in their entirety.

What is claimed is:

1. A method of fabricating a multilevel structure, comprising:
    forming a stack comprising an alternating plurality of first material layers and second material layers over a substrate;
    forming a hard mask layer over the stack;
    patterning the hard mask layer into multiple portions that are laterally spaced apart;
    forming and patterning a trimming material layer over the patterned hard mask layer; and
    performing at least once a set of processing steps that comprises:
        a first processing step of etching at least one physically exposed portion of the first material layers in a first etch process employing a combination of the patterned trimming material layer and the patterned hard mask layer as an etch mask;
        a second processing step of trimming the trimming material layer after the first etch process; and
        a third processing step of etching at least one physically exposed portion of the second material layers and a physically exposed portion of the patterned hard mask layer in a second etch process employing the trimming material layer as an etch mask.

2. The method of claim 1, wherein the trimming material layer has a sidewall that adjoins a top surface of a remaining portion among the multiple portions of the hard mask layer during each first processing step.

3. The method of claim 2, wherein the trimming material layer has a sidewall that is located between, and does not contact, a neighboring pair of portions of the hard mask layer after each second processing step and prior to a subsequent third processing step.

4. The method of claim 1, wherein the set of processing steps further comprises a fourth processing step of further trimming the trimming material layer after the second etch process.

5. The method of claim 4, wherein the trimming material layer has a sidewall that adjoins a top surface of a remaining portion among the multiple portions of the hard mask layer after each fourth processing step.

6. The method of claim 4, wherein each first etch process is an anisotropic etch process that etches a material of the first material layers selective to a material of the second material layers.

7. The method of claim 6, wherein each second etch process is an anisotropic etch process that etches a material of the second material layers and a material of the hard mask layer selective to a material of the first material layers.

8. The method of claim 7, wherein the first material layers comprise silicon oxide, and the second material layers and the hard mask layer comprise silicon nitride.

9. The method of claim 4, wherein:
the second material layers are employed as etch stop layers for each first etch process; and
the first material layers are employed as etch stop layers for each second etch process.

10. The method of claim 4, wherein:
a sidewall of the trimming material layer is shifted from above a first portion of the hard mask layer to a location between the first portion and a second portion of the hard mask layer that is a neighboring portion of the first portion during each second processing step; and
the first portion of the hard mask layer is removed during a subsequent third processing step.

11. The method of claim 10, wherein the sidewall of the trimming material layer is further shifted to the second portion of the hard mask layer during a subsequent fourth processing step.

12. The method of claim 1, wherein the trimming material layer comprises a material selected from a photoresist material, an organic polymer material, and an inorganic polymer material.

13. The method of claim 4, wherein the trimming material layer is trimmed selective to the materials of the first material layers and the second material layers during each second processing step, and wherein the trimming material layer is trimmed selective to the first material layers and the second material layers during each fourth processing step.

14. The method of claim 1, wherein:
a topmost layer of the stack is a topmost first material layer; and
the hard mask layer is formed directly on the topmost first material layer.

15. The method of claim 1, wherein at least one respective physically exposed portion of the second material layers and at least one respective physically exposed portion of the patterned hard mask layer are simultaneously etched in each of the at least one third processing step.

16. The method of claim 5, wherein the hard mask layer comprises a same material as the second material layers.

17. The method of claim 16, wherein the hard mask layer and the second material layers comprise silicon nitride.

18. The method of claim 17, wherein the first material layers comprise silicon oxide.

19. The method of claim 15, wherein the hard mask layer has a thickness that is the same as or less than a maximum thickness of the second material layers.

20. The method of claim 15, wherein the hard mask layer has a thickness that is greater than a maximum thickness of the second material layers.

21. The method of claim 1, wherein:
the set of processing steps is repeatedly performed a plurality of times; and
remaining portion of the first material layers and second material layers constitute a stepped structure having a plurality of steps.

22. The method of claim 21, wherein:
the patterned multiple portions of the hard mask layer comprises strips having parallel edges; and
a minimum width of each step of the plurality of steps is about a sum of four times a trimming width variation of the trimming material layer and a variance in critical dimension of a lithographic process employed to pattern the hard mask layer.

23. The method of claim 22, wherein:
a center-to-center distance between each neighboring pair of patterned multiple portions of the hard mask layer is the same; and
the patterned multiple portions of the hard mask layer constitutes a periodic one-dimensional array having a repetition of a unit pattern.

24. The method of claim 22, wherein:
neighboring pairs of patterned multiple portions of the hard mask layer have at least two different center-to-center distances;
the patterned multiple portions of the hard mask layer have at least two different widths; and
the plurality of steps have at least two different step widths.

25. The method of claim 21, further comprising forming a retro-stepped dielectric material portion over the steps, wherein a lateral extent of the retro-stepped dielectric material portion increases as a function of a vertical distance from a top surface of the substrate.

26. The method of claim 25, further comprising forming a plurality of contact via structures having different heights through the retro-stepped dielectric material portion.

27. The method of claim 26, wherein the plurality of contact via structures have top surfaces located within a same horizontal plane.

28. The method of claim 26, wherein the second material layers are sacrificial material layers, and the method further comprises replacing the second material layers with electrically conductive layers.

29. The method of claim 28, wherein each of the plurality of contact via structures is formed directly on a top surface of a respective electrically conductive layer.

30. The method of claim 28, further comprising forming at least one memory stack structure within the stack, wherein a subset of the electrically conductive layers comprises control gate electrodes for the at least one memory stack structure.

31. The method of claim 30, wherein the plurality of contact via structures comprise control gate contact via structures that contact respective electrically conductive layers within the subset of electrically conductive layers.

32. The method of claim 28, further comprising forming a device on the substrate, wherein:
the device comprises a vertical NAND device; and
at least one of the electrically conductive layers in the stack comprises, or is electrically connected to, a word line of the vertical NAND device.

33. The method of claim 32, wherein:
the NAND device comprises:
a plurality of semiconductor channels, wherein at least one end portion of each of the plurality of semiconductor channels extends substantially perpendicular to a top surface of the semiconductor substrate;
a plurality of charge storage elements, each charge storage element located adjacent to a respective one of the plurality of semiconductor channels; and
a plurality of control gate electrodes having a portion shape extending substantially parallel to the top surface of the substrate;
the plurality of control gate electrodes comprise at least a first control gate electrode located in the first device level and a second control gate electrode located in the second device level;
the electrically conductive layers in the stack comprise, or are in electrical contact with, the plurality of control gate electrodes and extends from the device region to a contact region containing the plurality of electrically conductive via connections; and
the substrate comprises a silicon substrate containing a driver circuit for the NAND device.

* * * * *